US012794434B2

(12) United States Patent
Nakatsutsumi

(10) Patent No.: US 12,794,434 B2
(45) Date of Patent: Nov. 10, 2026

(54) MULTILAYER ELECTRONIC COMPONENT

(71) Applicant: TDK Corporation, Tokyo (JP)

(72) Inventor: Jun Nakatsutsumi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 78 days.

(21) Appl. No.: 18/814,607

(22) Filed: Aug. 26, 2024

(65) Prior Publication Data

US 2025/0080076 A1 Mar. 6, 2025

(30) Foreign Application Priority Data

Aug. 30, 2023 (JP) ................................ 2023-139718

(51) Int. Cl.
*H03H 7/01* (2006.01)

(52) U.S. Cl.
CPC ........ *H03H 7/0161* (2013.01); *H03H 7/0115* (2013.01)

(58) Field of Classification Search
CPC ...... H03H 7/0161; H03H 7/0115; H03H 7/09; H03H 7/1766; H03H 7/1775; H03H 2001/0085
See application file for complete search history.

(56) References Cited

U.S. PATENT DOCUMENTS 12,074,579 B2 * 8/2024 Luo ..................... H03H 7/1775
2014/0306782 A1 * 10/2014 Cho .................... H01P 1/20336
333/204
2017/0110240 A1 4/2017 Masuda et al.
2021/0044269 A1 2/2021 Taniguchi

* cited by examiner

*Primary Examiner* — Andrea Lindgren Baltzell
*Assistant Examiner* — Kimberly E Glenn
(74) *Attorney, Agent, or Firm* — XSENSUS LLP

(57) ABSTRACT

An electronic component includes a stack, a first inductor, a second inductor, a third inductor, and a shield conductor. The shield conductor includes a first conductor part provided on a side surface of the stack and a second conductor part provided on a side surface of the stack. The electronic component further includes a first connecting conductor that connects two columnar conductors of the first inductor and the first conductor part, a second connecting conductor that connects two columnar conductors of the second inductor and the second conductor part, and a third connecting conductor that connects two columnar conductors of the third inductor and the first conductor part.

13 Claims, 13 Drawing Sheets

MULTILAYER ELECTRONIC COMPONENT

CROSS-REFERENCE TO RELATED APPLICATION

This application claims the benefit of Japanese Priority Patent Application No. 2023-139718 filed on Aug. 30, 2023, the entire contents of which is incorporated herein by reference.

BACKGROUND OF THE INVENTION

1. Field of the Invention

The present invention relates to a multilayer electronic component including a shield conductor integrated with a stack.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, an LC resonator constituted by an inductor and a capacitor is used, for example.

The recent market requires reductions in size and footprint of the compact mobile communication apparatuses, and also requires downsizing of branching filters used in those communication apparatuses. As a branching filter suitable for downsizing, known is a multilayer branching filter using a stack including a plurality of dielectric layers and a plurality of conductor layers stacked together. As an inductor used for the multilayer branching filter, known is an inductor constituted by a conductor layer and a columnar conductor extending in a stacking direction of the plurality of dielectric layers. Such an inductor is disclosed in, for example, US 2021/0044269 A1.

Reductions in size and footprint of the compact mobile communication apparatuses have advanced an increase in density of mounted electronic components used for the communication apparatuses. As a result, spacing between the electronic components mounted on a mounting board has been reduced. As the spacing between the electronic components is reduced, electromagnetic interference between the electronic components is more likely to occur. It is conceivable that in order to suppress the electromagnetic interference, a shield is provided on a body of each electronic component. US 2017/0110240 A1 discloses an electronic component in which an external electrode is provided on a bottom surface of a stack of a multilayer electronic component and a shield electrode is provided on a surface other than the bottom surface of the stack of the multilayer electronic component.

When such an inductor constituted by a conductor layer and a columnar conductor as that disclosed in US 2021/

0044269 A1 is applied to such an electronic component including a shield as that disclosed in US 2017/0110240 A1, downsizing of a stack strengthens coupling between the columnar conductor and the shield. As a result, desired characteristics may not be achieved. This issue becomes noticeable especially in a case where a plurality of inductors are provided.

The above issue applies not only to multilayer branching filters but also to multilayer electronic components in general each of which includes a shield and an inductor constituted by a conductor layer and a columnar conductor.

SUMMARY OF THE INVENTION

An object of the present invention is to provide a multilayer electronic component including a shield conductor integrated with a stack, and an inductor constituted by a conductor layer and a columnar conductor, the multilayer electronic component being configured to achieve desired characteristics while suppressing occurrence of an issue caused by the shield conductor.

A multilayer electronic component of the present invention includes a stack including a plurality of dielectric layers stacked together, a first inductor, a second inductor, and a third inductor provided in the stack, and a shield conductor constituted by a conductor and integrated with the stack. The stack includes a first surface and a second surface located at both ends of the stack in a stacking direction of the plurality of dielectric layers, and a first side surface, a second side surface, a third side surface, and a fourth side surface connecting the first surface and the second surface. The first side surface and the second side surface face opposite directions. The third side surface and the fourth side surface face opposite directions. The shield conductor includes a first conductor part provided on the first side surface and a second conductor part provided on the second side surface.

The second inductor is arranged between the first inductor and the third inductor. Each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer. The first end of the conductor layer is located at a position closer to the first conductor part than to the second conductor part. The second end of the conductor layer is located at a position closer to the second conductor part than to the first conductor part.

The multilayer electronic component of the present invention further includes a first connecting conductor that connects the first columnar conductor of the first inductor and the first conductor part, a second connecting conductor that connects the second columnar conductor of the second inductor and the second conductor part, and a third connecting conductor that connects the first columnar conductor of the third inductor and the first conductor part.

In the multilayer electronic component of the present invention, the first columnar conductor of each of the first and third inductors is connected to the first conductor part of the shield conductor, and the second columnar conductor of the second inductor is connected to the second conductor part of the shield conductor. Thus, the present invention can achieve desired characteristics while suppressing occurrence of an issue caused by a shield conductor.

Other and further objects, features, and advantages of the present invention will appear more fully from the following description.

DETAILED DESCRIPTION OF THE PREFERRED EMBODIMENTS

Figure 1:
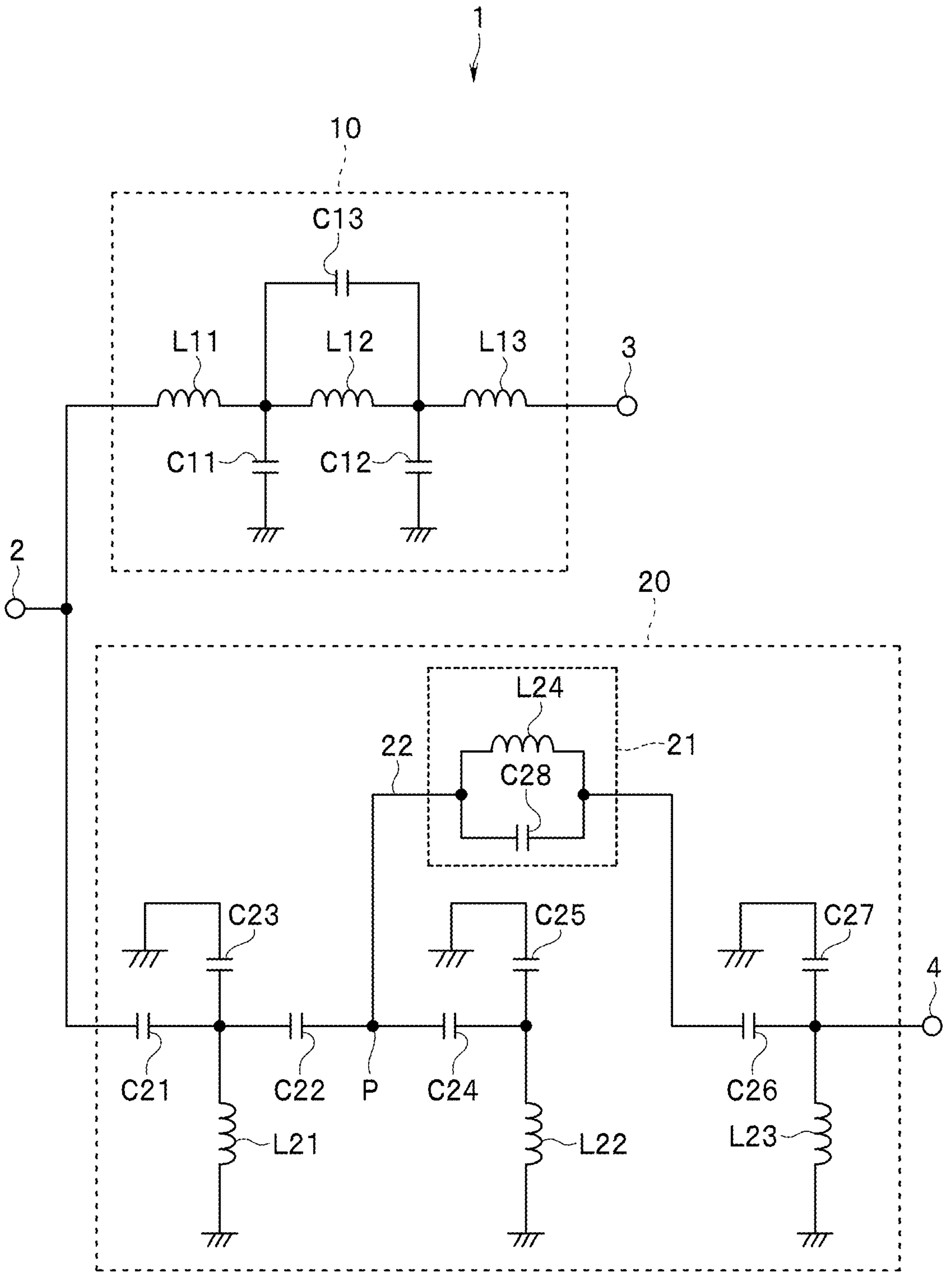
FIG. 1 is a circuit diagram showing an example of a circuit configuration of a multilayer electronic component according to an embodiment of the present invention.

An embodiment of the present invention will be described below in detail with reference to the drawings. First, a configuration of a multilayer electronic component (hereinafter simply described as an electronic component) 1 according to an embodiment of the present invention will be outlined with reference to FIG. 1. FIG. 1 is a circuit diagram showing a circuit configuration of the electronic component 1. FIG. 1 shows, as an example of the electronic component 1, a branching filter (diplexer). The electronic component 1 includes a common terminal 2, a first signal terminal 3, a second signal terminal 4, a first filter 10, and a second filter 20.

The first filter 10 is provided between the common terminal 2 and the first signal terminal 3 in a circuit configuration. The second filter 20 is provided between the common terminal 2 and the second signal terminal 4 in a circuit configuration. Note that, in the present application, the expression "in the (a) circuit configuration" is used to indicate not layout in physical configuration but layout in the circuit diagram.

The first filter 10 is a filter that selectively allows a signal of a frequency within a first passband to pass. The second filter 20 is a filter that selectively allows a signal of a frequency within a second passband higher than the first passband to pass. Each of the first and second filters 10 and 20 is constituted by an LC filter circuit including at least one inductor and at least one capacitor.

The common terminal 2 corresponds to a "first terminal" in the present invention. The first signal terminal 3 corresponds to a "third terminal" in the present invention. The second signal terminal 4 corresponds to a "second terminal" in the present invention. The first filter 10 corresponds to a "second circuit" in the present invention. The second filter 20 corresponds to a "first circuit" in the present invention.

A first signal of the frequency within the first passband input to the common terminal 2 selectively passes the first filter 10, and is output from the first signal terminal 3. A second signal of the frequency within the second passband input to the common terminal 2 selectively passes the second filter 20, and is output from the second signal terminal 4. In such a manner, the electronic component 1 separates the first and second signals.

Next, examples of respective configurations of the first and second filters 10 and 20 will be described with reference to FIG. 1. First, the configuration of the first filter 10 will be described. The first filter 10 includes inductors L11, L12, and L13 and capacitors C11, C12, and C13.

One end of the inductor L11 is connected to the common terminal 2. One end of the inductor L12 is connected to the other end of the inductor L11. One end of the inductor L13 is connected to the other end of the inductor L12. The other end of the inductor L13 is connected to the first signal terminal 3.

One end of the capacitor C11 is connected to a connection point between the inductors L11 and L12. One end of the capacitor C12 is connected to a connection point between the inductors L12 and L13. The other end of each of the capacitors C11 and C12 is connected to the ground. The capacitor C13 is connected in parallel with the inductor L12.

Next, the configuration of the second filter 20 will be described. The second filter 20 includes a first inductor L21, a second inductor L22, a third inductor L23, a fourth inductor L24, and capacitors C21, C22, C23, C24, C25, C26, C27, and C28.

One end of the capacitor C21 is connected to the common terminal 2. One end of the capacitor C22 is connected to the other end of the capacitor C21.

One end of the first inductor L21 is connected to a connection point between the capacitors C21 and C22. The other end of the first inductor L21 is connected to the ground. One end of the capacitor C23 is connected to the one end of the first inductor L21. The other end of the capacitor C23 is connected to the ground.

One end of the capacitor C24 is connected to the other end of the capacitor C22. One end of the second inductor L22 is connected to the other end of the capacitor C24. The other end of the second inductor L22 is connected to the ground. One end of the capacitor C25 is connected to the one end of the second inductor L22. The other end of the capacitor C25 is connected to the ground.

One end of the fourth inductor L24 is connected to a connection point between the capacitors C22 and C24. The capacitor C28 is connected in parallel with the fourth inductor L24.

One end of the capacitor C26 is connected to the other end of the fourth inductor L24. The other end of the capacitor C26 is connected to the second signal terminal 4. One end of the third inductor L23 is connected to the other end of the capacitor C26. The other end of the third inductor L23 is connected to the ground. One end of the capacitor C27 is connected to the one end of the third inductor L23. The other end of the capacitor C27 is connected to the ground.

The electronic component 1 further includes a parallel resonance circuit 21. Particularly in the present embodiment, the filter 20 includes the parallel resonance circuit 21. In FIG. 1, a reference sign P indicates a node present between the one end of the first inductor L21 and the one end of the second inductor L22 in a circuit configuration. The parallel resonance circuit 21 is provided on a path 22 connecting the node P and the one end of the third inductor L23. In an example shown in FIG. 1, the parallel resonance circuit 21 includes the fourth inductor L24 and the capacitor C28.

Figure 2:
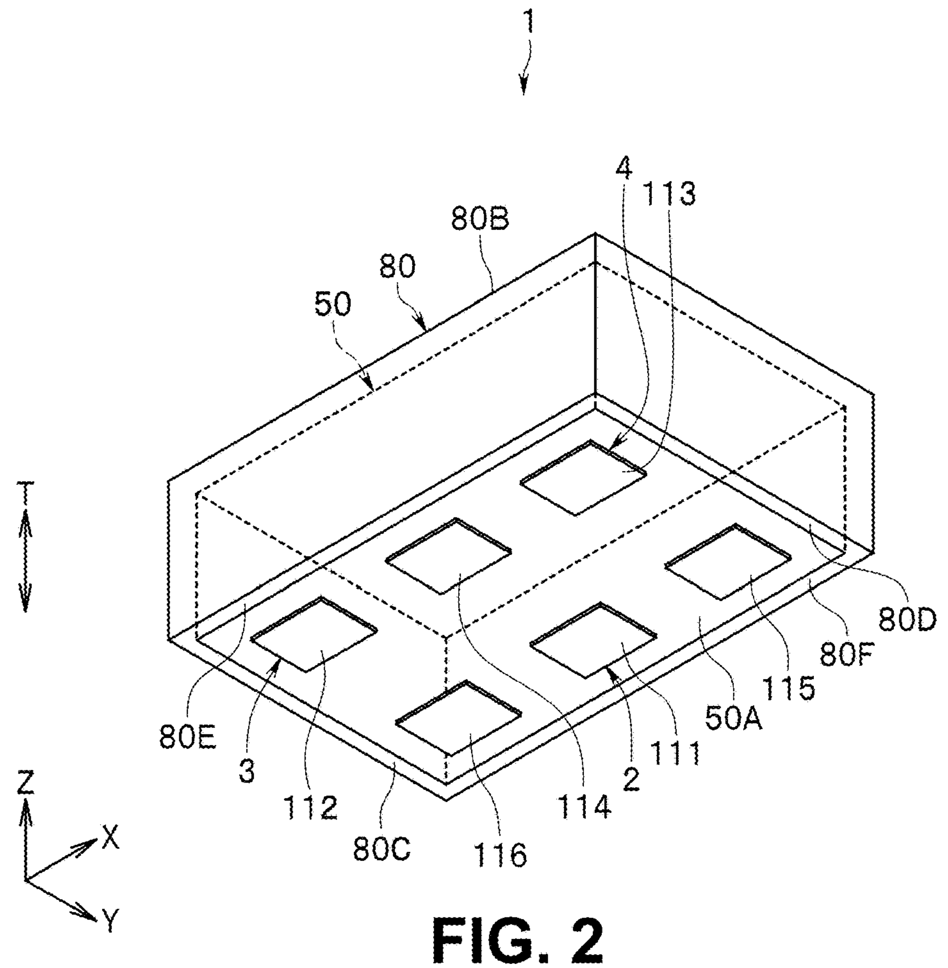
FIG. 2 is an external perspective view of the multilayer electronic component according to the embodiment of the present invention.
Figure 3:
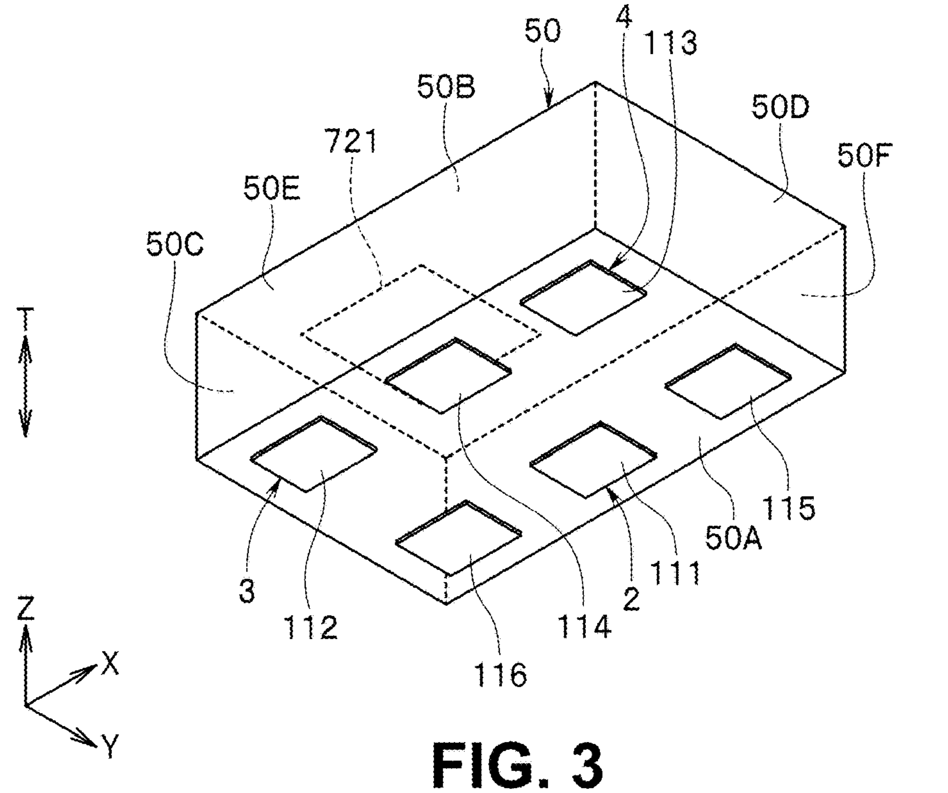
FIG. 3 is a perspective view showing a stack of the multilayer electronic component according to the embodiment of the present invention.

Next, other configurations of the electronic component 1 will be described with reference to FIGS. 2 and 3. FIG. 2 is an external perspective view of the electronic component 1. FIG. 3 is a perspective view showing a stack of the electronic component 1.

The electronic component 1 includes a stack 50. The stack 50 includes a plurality of dielectric layers stacked together and a plurality of conductors (a plurality of conductor layers and a plurality of through holes). The common terminal 2, the first signal terminal 3, the second signal terminal 4, the first filter 10, the second filter 20, and the parallel resonance circuit 21 are integrated with the stack 50.

The stack 50 includes a first surface 50A and a second surface 50B located at both ends in a stacking direction T of the plurality of dielectric layers, and four side surfaces 50C to 50F connecting the first surface 50A and the second surface 50B. The side surfaces 50C and 50D face opposite directions, and also the side surfaces 50E and 50F face opposite directions. The side surfaces 50C to 50F may each be perpendicular to both the first surface 50A and the second surface 50B.

Here, as shown in FIGS. 2 and 3, an X direction, a Y direction, and a Z direction are defined. The X direction, the Y direction, and the Z direction are orthogonal to one another. In the present embodiment, a direction in parallel to the stacking direction T is defined as the Z direction. A direction opposite to the X direction is defined as a −X direction, a direction opposite to the Y direction is defined as a −Y direction, and a direction opposite to the Z direction is defined as a −Z direction. The expression "when seen in the stacking direction T" means that an object is viewed from a position away in the Z or −Z direction.

As shown in FIG. 3, the first surface 50A is located at the end of the stack 50 in the −Z direction. The first surface 50A is also a bottom surface of the stack 50. The second surface 50B is located at the end of the stack 50 in the Z direction. The second surface 50B is also a top surface of the stack 50. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

As shown in FIGS. 2 and 3, the electronic component 1 further includes electrodes 111, 112, and 113 provided on the first surface 50A of the stack 50. The electrode 111 is arranged at a position closer to the side surface 50F than to the side surface 50E. The electrodes 112 and 113 are arranged at a position closer to the side surface 50E than to the side surface 50F. The electrode 112 is arranged near a corner portion located at a position where the side surface 50C and the side surface 50E cross, and the electrode 113 is arranged near a corner portion located at a position where the side surface 50D and the side surface 50E cross. The electrode 111, the electrode 112, and the electrode 113 correspond to the common terminal 2, the first signal terminal 3, and the second signal terminal 4, respectively. Accordingly, the common terminal 2 and the first and second signal terminals 3 and 4 are provided on the first surface 50A of the stack 50.

The electronic component 1 further includes electrodes 114, 115, and 116 provided on the first surface 50A of the stack 50. The electrode 114 is arranged between the electrodes 112 and 113. The electrode 115 is arranged between the electrode 111 and the side surface 50D. The electrode 116 is arranged between the electrode 111 and the side surface 50C. Each of the electrodes 114, 115, and 116 is connected to the ground.

The electronic component 1 further includes a shield conductor 80 constituted by a conductor and integrated with the stack 50. The shield conductor 80 includes a first conductor part 80E provided on the side surface 50E of the stack 50 and a second conductor part 80F provided on the side surface 50F of the stack 50. Particularly in the present embodiment, the first conductor part 80E covers all or substantially all the side surface 50E. The second conductor part 80F covers all or substantially all the side surface 50F.

The shield conductor 80 further includes a conductor part 80B provided on the second surface 50B of the stack 50, a conductor part 80C provided on the side surface 50C of the stack 50, and a conductor part 80D provided on the side surface 50D of the stack 50. Particularly in the present embodiment, the conductor part 80B covers all the second surface 50B. The conductor part 80C covers all or substantially all the side surface 50C. The conductor part 80D covers all or substantially all the side surface 50D.

The shield conductor 80 may include a plurality of metal layers stacked together. In this case, it is preferable that the first conductor part 80E, the second conductor part 80F, and the conductor parts 80B, 80C, and 80D be continuous. In other words, it is preferable that each of the first and second conductor parts 80E and 80F be connected to the conductor parts 80B to 80D.

The shield conductor 80 is electrically connected to the electrodes 114, 115, and 116. The stack 50 includes a plurality of conductors for electrically connecting the shield conductor 80 and the electrodes 114, 115, and 116.

Next, with reference to FIGS. 4A to 10B, an example of the plurality of dielectric layers and the plurality of conductors constituting the stack 50 will be described. In this example, the stack 50 includes twenty two dielectric layers stacked together. The twenty two dielectric layers are hereinafter referred to as first to twenty-second dielectric layers in the order from bottom to top. The first to twenty-second dielectric layers are denoted by reference numerals 51 to 72, respectively.

In FIGS. 4A to 9B, a plurality of circles represent a plurality of through holes. Each of the dielectric layers 51 to 68 has a plurality of through holes formed. Each of the plurality of through holes is formed by filling a hole intended for a through hole with a conductive paste. Each of the plurality of through holes is connected to an electrode, a conductor layer, or another through hole.

In FIGS. 4A to 9B, a plurality of specific through holes out of the plurality of through holes are denoted by reference numerals. The connection relation between each of the plurality of specific through holes and a conductor layer or another through hole is described as a connection relation in a state where the first to twenty-second dielectric layers 51 to 72 are stacked together.

Figure 4A:
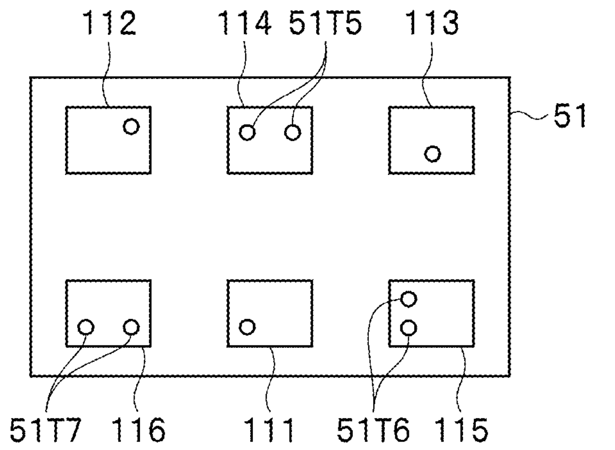
FIGS. 4A to 4C are explanatory diagrams showing respective patterned surfaces of first to third dielectric layers of the stack of the multilayer electronic component according to the embodiment of the present invention.

FIG. 4A shows a patterned surface of the first dielectric layer 51. The electrodes 111 to 116 are formed on the patterned surface of the dielectric layer 51.

Two through holes denoted by a reference numeral 51T5 in FIG. 4A are connected to the electrode 114. Note that, in the following description, each through hole denoted by the reference numeral 51T5 is simply referred to as a through hole 51T5. Such manner for through hole 51T5 similarly applies to through holes denoted by reference numerals other than the through hole 51T5.

Two through holes 51T6 shown in FIG. 4A are connected to the electrode 115. Two through holes 51T7 shown in FIG. 4A are connected to the electrode 116.

Figure 4B:
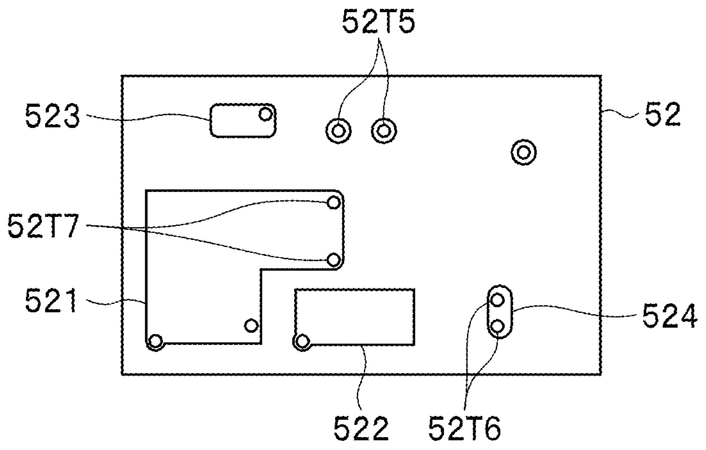

FIG. 4B shows a patterned surface of the second dielectric layer 52. Conductor layers 521, 522, 523, and 524 are formed on the patterned surface of the dielectric layer 52.

The two through holes 51T5 are connected to two through holes 52T5 shown in FIG. 4B. The two through holes 51T6 and two through holes 52T6 shown in FIG. 4B are connected to the conductor layer 524. The two through holes 51T7 and two through holes 52T7 shown in FIG. 4B are connected to the conductor layer 521.

Figure 4C:
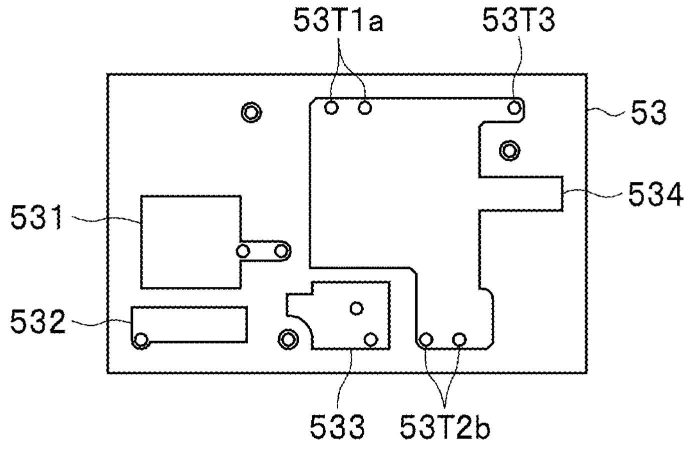

FIG. 4C shows a patterned surface of the third dielectric layer 53. Conductor layers 531, 532, 533, and 534 are formed on the patterned surface of the dielectric layer 53.

The two through holes 52T5, the two through holes 52T6, and the two through holes 52T7 and two through holes 53T1*a*, two through holes 53T2*b*, and through hole 53T3 shown in FIG. 4C are connected to the conductor layer 534.

Figure 5A:
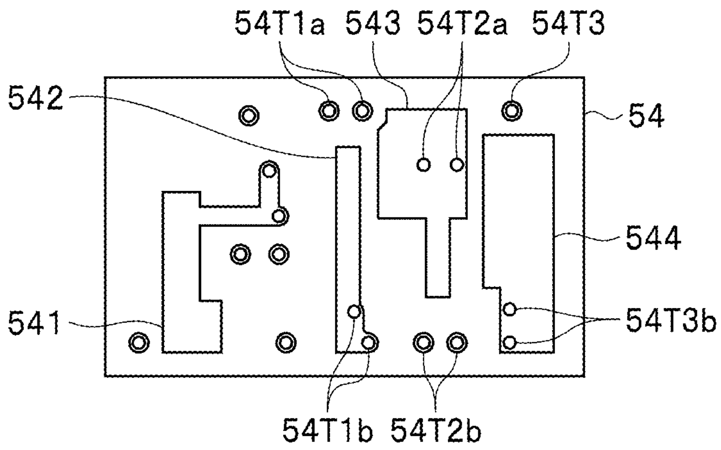
FIGS. 5A to 5C are explanatory diagrams showing respective patterned surfaces of fourth to sixth dielectric layers of the stack of the multilayer electronic component according to the embodiment of the present invention.

FIG. 5A shows a patterned surface of the fourth dielectric layer 54. Conductor layers 541, 542, 543, and 544 are formed on the patterned surface of the dielectric layer 54.

The two through holes 53T1*a* and the two through holes 53T2*b* are connected to two through holes 54T1*a* and two through holes 54T2*b* shown in FIG. 5A, respectively. Two through holes 54T1*b* shown in FIG. 5A are connected to the conductor layer 542. Two through holes 54T2*a* and two through holes 54T3*b* shown in FIG. 5A are connected to the conductor layer 543*s* and 544, respectively. The through hole 53T3 is connected to a through hole 54T3 shown in FIG. 5A.

Figure 5B:
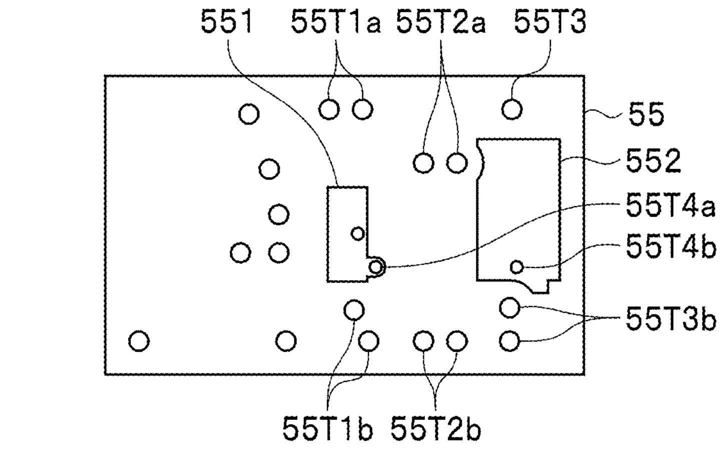

FIG. 5B shows a patterned surface of the fifth dielectric layer 55. Conductor layers 551 and 552 are formed on the patterned surface of the dielectric layer 55.

The two through holes 54T1*a*, the two through holes 54T1*b*, the two through holes 54T2*a*, the two through holes 54T2*b*, and the two through holes 54T3*b* are connected to two through holes 55T1*a*, two through holes 55T1*b*, two through holes 55T2*a*, two through holes 55T2*b*, and two through holes 55T3*b* shown in FIG. 5B, respectively. The through hole 54T3 is connected to a through hole 55T3 shown in FIG. 5B. A through hole 55T4*a* and a through hole 55T4*b* shown in FIG. 5B are connected to the conductor layers 551 and 552, respectively.

Figure 5C:
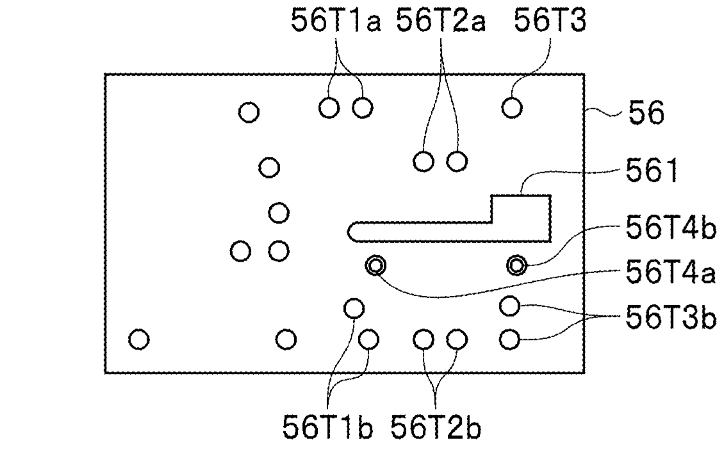

FIG. 5C shows a patterned surface of the sixth dielectric layer 56. A conductor layer 561 is formed on the patterned surface of the dielectric layer 56.

The two through holes 55T1*a*, the two through holes 55T1*b*, the two through holes 55T2*a*, the two through holes 55T2*b*, and the two through holes 55T3*b* are connected to two through holes 56T1*a*, two through holes 56T1*b*, two through holes 56T2*a*, two through holes 56T2*b*, and two through holes 56T3*b* shown in FIG. 5C, respectively. The through holes 55T3, 55T4*a*, and 55T4*b* are connected to through holes 56T3, 56T4*a*, and 56T4*b* shown in FIG. 5C, respectively.

Figure 6A:
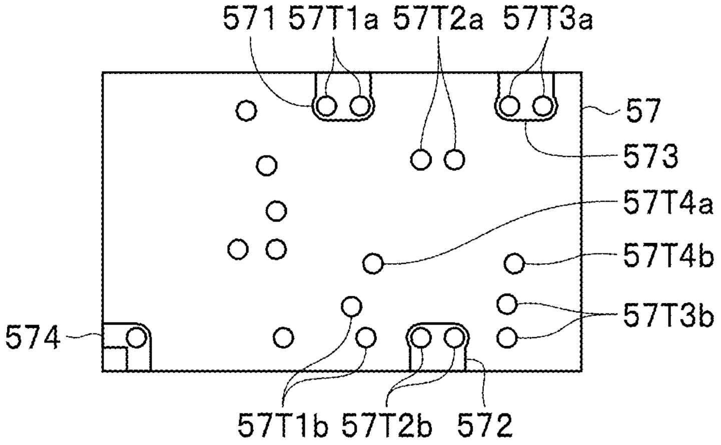
FIG. 6A is an explanatory diagram showing a patterned surface of a seventh dielectric layer of the stack of the multilayer electronic component according to the embodiment of the present invention.

FIG. 6A shows a patterned surface of the seventh dielectric layer 57. Conductor layers 571, 572, 573, and 574 are formed on the patterned surface of the dielectric layer 57. The conductor layers 571 and 573 are connected to the first conductor part 80E of the shield conductor 80 (see FIG. 2). The conductor layer 572 is connected to the second conductor part 80F of the shield conductor 80 (see FIG. 2). The conductor layer 574 is connected to the second conductor part 80F and the conductor part 80C of the shield conductor 80 (see FIG. 2).

The two through holes 56T1*a* and two through holes 57T1*a* shown in FIG. 6A are connected to the conductor layer 571. The two through holes 56T2*b* and two through holes 57T2*b* shown in FIG. 6A are connected to the conductor layer 572. The through hole 56T3 and two through holes 57T3*a* shown in FIG. 6A are connected to the conductor layer 573. The two through holes 56T1*b*, the two through holes 56T2*a*, and the two through holes 56T3*b* are connected to two through holes 57T1*b*, two through holes 57T2*a*, and two through holes 57T3*b* shown in FIG. 6A, respectively. The through holes 56T4*a* and 56T4B are connected to through holes 57T4*a* and 57T4*b* shown in FIG. 6A, respectively.

Figure 6B:
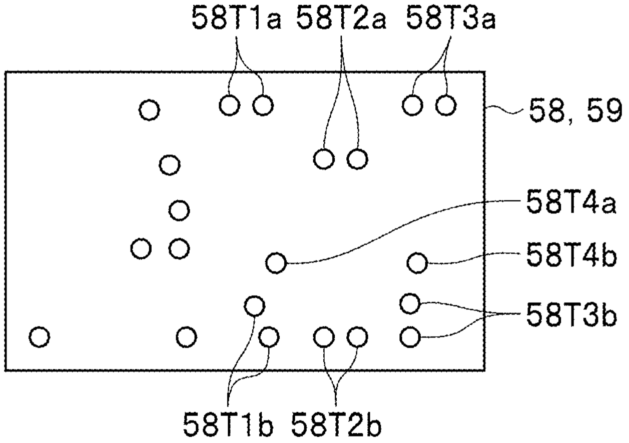
FIG. 6B is an explanatory diagram showing a patterned surface of each of eighth and ninth dielectric layers of the stack of the multilayer electronic component according to the embodiment of the present invention.

FIG. 6B shows a patterned surface of each of the eighth and ninth dielectric layers 58 and 59. The two through holes 57T1*a*, the two through holes 57T1*b*, the two through holes 57T2*a*, the two through holes 57T2*b*, the two through holes 57T3*a*, and the two through holes 57T3*b* are connected to two through holes 58T1*a*, two through holes 58T1*b*, two through holes 58T2*a*, two through holes 58T2*b*, two through holes 58T3*a*, and two through holes 58T3*b* formed on the dielectric layer 58, respectively. The through holes 57T4*a* and 57T4*b* are connected to through holes 58T4*a* and 58T4*b* formed on the dielectric layer 58, respectively. In the dielectric layers 58 and 59, vertically adjacent through holes denoted by the same reference numerals are connected to each other.

Figure 6C:
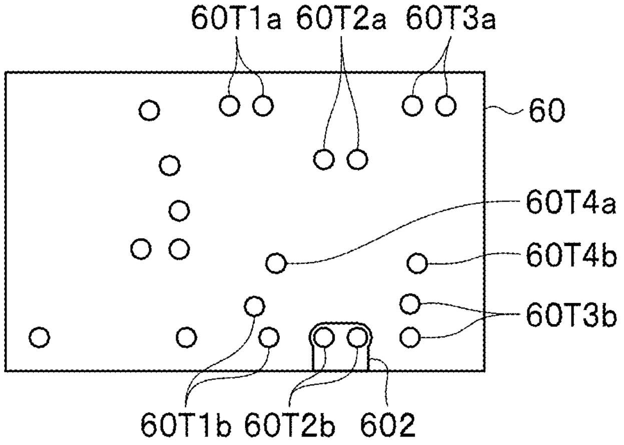
FIG. 6C is an explanatory diagram showing a patterned surface of a tenth dielectric layer of the stack of the multilayer electronic component according to the embodiment of the present invention.

FIG. 6C shows a patterned surface of the tenth dielectric layer 60. A conductor layer 602 is formed on the patterned surface of the dielectric layer 60. The conductor layer 602 is connected to the second conductor part 80F of the shield conductor 80 (see FIG. 2).

The two through holes 58T1*a*, the two through holes 58T1*b*, the two through holes 58T2*a*, the two through holes 58T3*a*, and the two through holes 58T3*b* formed on the dielectric layer 59 are connected to two through holes 60T1*a*, two through holes 60T1*b*, two through holes 60T2*a*, two through holes 60T3*a*, and two through holes 60T3*b* shown in FIG. 6C, respectively. The two through holes 58T2*b* formed on the dielectric layer 59 and two through holes 60T2*b* shown in FIG. 6C are connected to the conductor layer 602. The through holes 58T4*a* and 58T4*b* formed on the dielectric layer 59 are connected to through holes 60T4*a* and 60T4*b* shown in FIG. 6C, respectively.

Figure 7A:
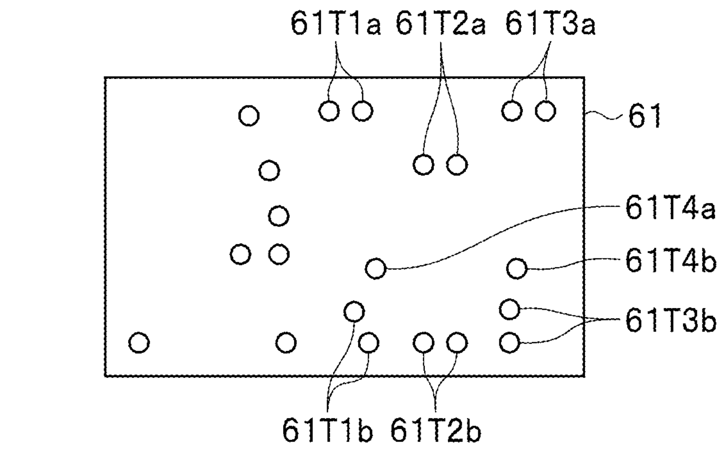
FIGS. 7A to 7C are explanatory diagrams showing respective patterned surfaces of eleventh to thirteenth dielectric layers of the stack of the multilayer electronic component according to the embodiment of the present invention.

FIG. 7A shows a patterned surface of the eleventh dielectric layer 61. The two through holes 60T1*a*, the two through holes 60T1*b*, the two through holes 60T2*a*, the two through holes 60T2*b*, the two through holes 60T3*a*, and the two through holes 60T3*b* are connected to two through holes 61T1*a*, two through holes 61T1*b*, two through holes 61T2*a*, two through holes 61T2*b*, two through holes 61T3*a*, and two through holes 61T3*b* shown in FIG. 7A, respectively. The through holes 60T4*a* and 60T4*b* are connected to through holes 61T4*a* and 61T4*b* shown in FIG. 7A, respectively.

Figure 7B:
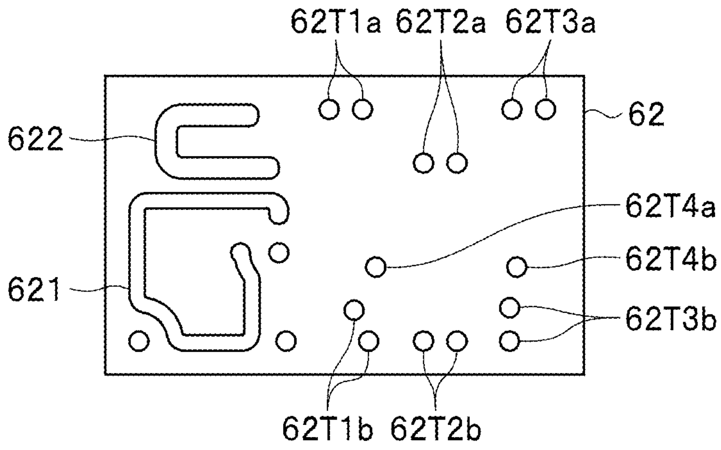

FIG. 7B shows a patterned surface of the twelfth dielectric layer 62. Inductor conductor layers 621 and 622 are formed on the patterned surface of the dielectric layer 62.

The two through holes 61T1*a*, the two through holes 61T1*b*, the two through holes 61T2*a*, the two through holes 61T2*b*, the two through holes 61T3*a*, and the two through holes 61T3*b* are connected to two through holes 62T1*a*, two through holes 62T1*b*, two through holes 62T2*a*, two through holes 62T2*b*, two through holes 62T3*a*, and two through holes 62T3*b* shown in FIG. 7B, respectively. The through holes 61T4*a* and 61T4*b* are connected to through holes 62T4*a* and 62T4*b* shown in FIG. 7B, respectively.

Figure 7C:
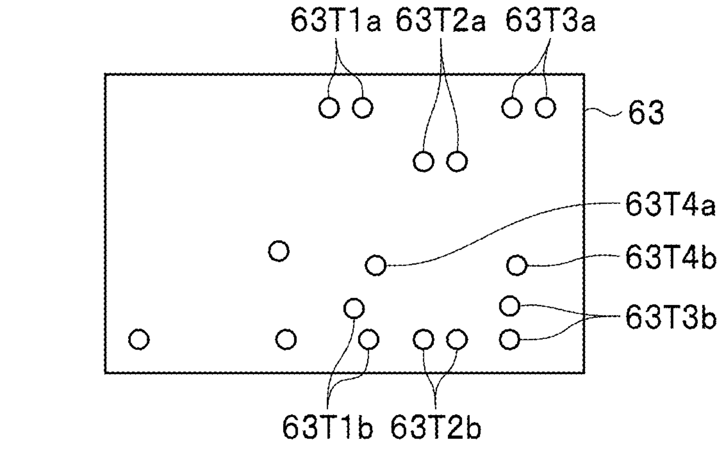

FIG. 7C shows a patterned surface of the thirteenth dielectric layer 63. The two through holes 62T1*a*, the two through holes 62T1*b*, the two through holes 62T2*a*, the two through holes 62T2*b*, the two through holes 62T3*a*, and the two through holes 62T3*b* are connected to two through holes 63T1*a*, two through holes 63T1*b*, two through holes 63T2*a*, two through holes 63T2*b*, two through holes 63T3*a*, and two through holes 63T3*b* shown in FIG. 7C, respectively. The through holes 62T4*a* and 62T4*b* are connected to through holes 63T4*a* and 63T4*b* shown in FIG. 7C, respectively.

Figure 8A:
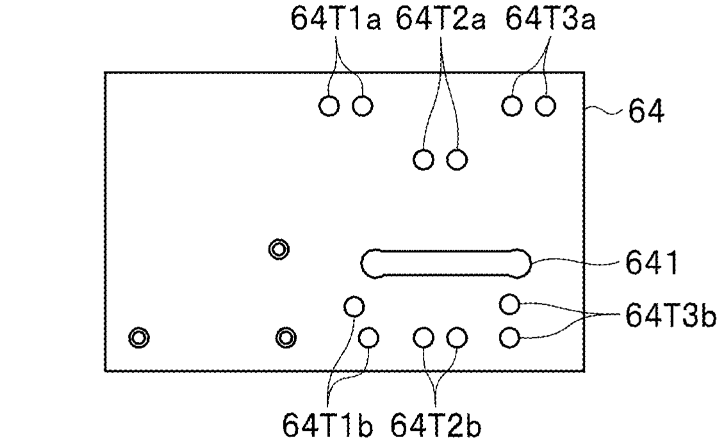
FIGS. 8A to 8C are explanatory diagrams showing respective patterned surfaces of fourteenth to sixteenth dielectric layers of the stack of the multilayer electronic component according to the embodiment of the present invention.

FIG. 8A shows a patterned surface of the fourteenth dielectric layer 64. An inductor conductor layer 641 is formed on the patterned surface of the dielectric layer 64. The conductor layer 641 includes a first end and a second end located at both longitudinal ends of the conductor layer 641. The through hole 63T4*a* is connected to a portion near the first end of the conductor layer 641. The through hole 63T4*b* is connected to a portion near the second end of the conductor layer 641.

The two through holes 63T1*a*, the two through holes 63T1*b*, the two through holes 63T2*a*, the two through holes 63T2*b*, the two through holes 63T3*a*, and the two through holes 63T3*b* are connected to two through holes 64T1*a*, two through holes 64T1*b*, two through holes 64T2*a*, two through holes 64T2*b*, two through holes 64T3*a*, and two through holes 64T3*b* shown in FIG. 8A, respectively.

Figure 8B:
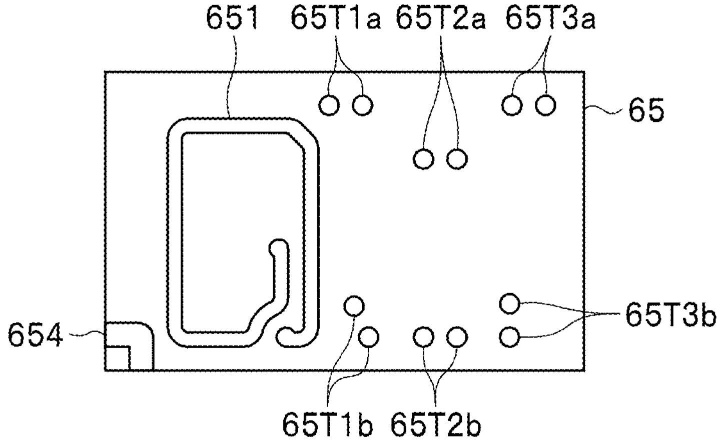

FIG. 8B shows a patterned surface of the fifteenth dielectric layer 65. An inductor conductor layer 651 and a conductor layer 654 are formed on the patterned surface of the dielectric layer 65. The conductor layer 654 is connected to the second conductor part 80F and the conductor part 80C of the shield conductor 80 (see FIG. 2).

The two through holes 64T1*a*, the two through holes 64T1*b*, the two through holes 64T2*a*, the two through holes 64T2*b*, the two through holes 64T3*a*, and the two through holes 64T3*b* are connected to two through holes 65T1*a*, two through holes 65T1*b*, two through holes 65T2*a*, two through holes 65T2*b*, two through holes 65T3*a*, and two through holes 65T3*b* shown in FIG. 8B, respectively.

Figure 8C:
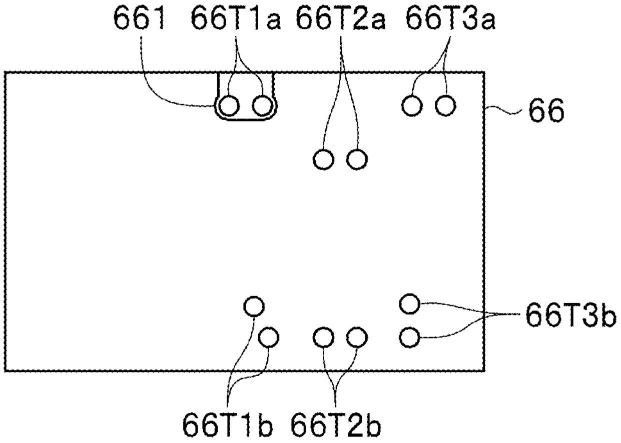

FIG. 8C shows a patterned surface of the sixteenth dielectric layer 66. A conductor layer 661 is formed on the patterned surface of the dielectric layer 66. The conductor layer 661 is connected to the first conductor part 80E of the shield conductor 80 (see FIG. 2).

The two through holes 65T1*a* and two through holes 66T1*a* shown in FIG. 8C are connected to the conductor layer 661. The two through holes 65T1*b*, the two through holes 65T2*a*, the two through holes 65T2*b*, the two through holes 65T3*a*, and the two through holes 65T3*b* are connected to two through holes 66T1*b*, two through holes 66T2*a*, two through holes 66T2*b*, two through holes 66T3*a*, and two through holes 66T3*b* shown in FIG. 8C, respectively.

Figure 9A:
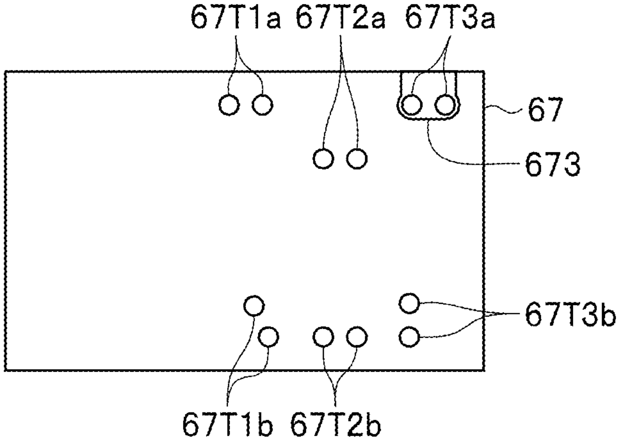
FIGS. 9A to 9C are explanatory diagrams showing respective patterned surfaces of seventeenth to nineteenth dielectric layers of the stack of the multilayer electronic component according to the embodiment of the present invention.

FIG. 9A shows a patterned surface of the seventeenth dielectric layer 67. A conductor layer 673 is formed on the patterned surface of the dielectric layer 67. The conductor layer 673 is connected to the first conductor part 80E of the shield conductor 80 (see FIG. 2).

The two through holes 66T1*a*, the two through holes 66T1*b*, the two through holes 66T2*a*, the two through holes 66T2*b*, and the two through holes 66T3*b* are connected to two through holes 67T1*a*, two through holes 67T1*b*, two through holes 67T2*a*, two through holes 67T2*b*, and two through holes 67T3*b* shown in FIG. 9A, respectively. The two through holes 66T3*a* and two through holes 67T3*a* shown in FIG. 9A are connected to the conductor layer 673.

Figure 9B:
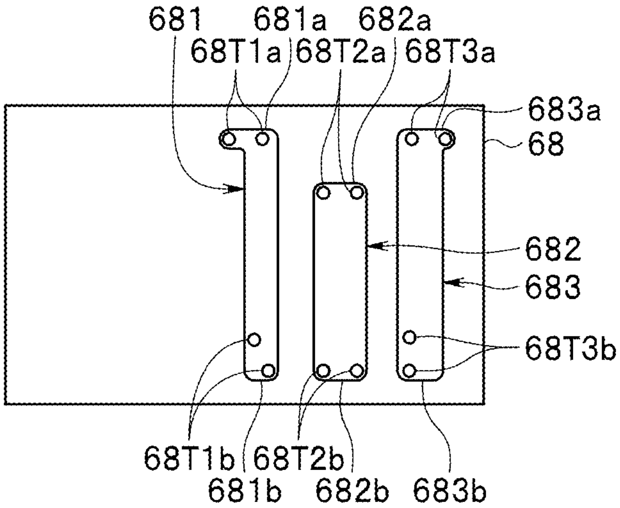

FIG. 9B shows a patterned surface of the eighteenth dielectric layer 68. Inductor conductor layers 681, 682, and 683 are formed on the patterned surface of the dielectric layer 68. The conductor layer 681 includes a first end 681*a* and a second end 681*b* located at both longitudinal ends of the conductor layer 681. The conductor layer 682 includes a first end 682*a* and a second end 682*b* located at both longitudinal ends of the conductor layer 682. The conductor layer 683 includes a first end 683*a* and a second end 683*b* located at both longitudinal ends of the conductor layer 683. Each of the first ends 681*a*, 682*a*, and 683*a* is located at a position closer to the first conductor part 80E of the shield conductor 80 than to the second conductor part 80F of the shield conductor 80 (upper position in FIG. 9B). Each of the second ends 681*b*, 682*b*, and 683*b* is located at a position closer to the second conductor part 80F of the shield conductor 80 than to the first conductor part 80E of the shield conductor 80 (lower position in FIG. 9B).

The two through holes 67T1*a* and two through holes 68T1*a* shown in FIG. 9B are connected to a portion near the first end 681*a* of the conductor layer 681. The two through holes 67T1*b* and two through holes 68T1*b* shown in FIG. 9B are connected to a portion near the second end 681*b* of the conductor layer 681. The two through holes 67T2*a* and two through holes 68T2*a* shown in FIG. 9B are connected to a portion near the first end 682*a* of the conductor layer 682. The two through holes 67T2*b* and two through holes 68T2*b* shown in FIG. 9B are connected to a portion near the second end 682*b* of the conductor layer 682. The two through holes 67T3*a* and two through holes 68T3*a* shown in FIG. 9B are connected to a portion near the first end 683*a* of the conductor layer 683. The two through holes 67T3*b* and two through holes 68T3*b* shown in FIG. 9B are connected to a portion near the second end 683*b* of the conductor layer 683.

Figure 9C:
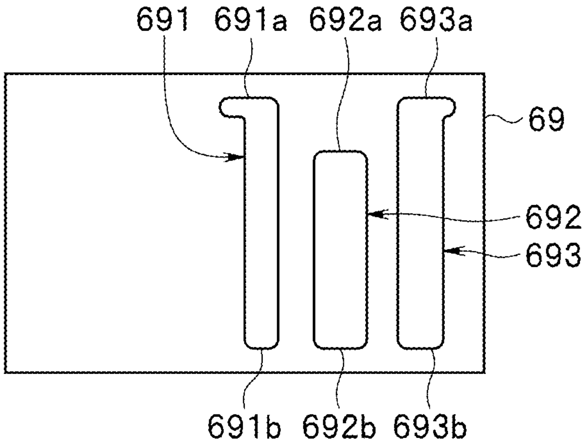

FIG. 9C shows a patterned surface of the nineteenth dielectric layer 69. Inductor conductor layers 691, 692, and 693 are formed on the patterned surface of the dielectric layer 69. The conductor layer 691 includes a first end 691*a* and a second end 691*b* located at both longitudinal ends of the conductor layer 691. The conductor layer 692 includes a first end 692*a* and a second end 692*b* located at both longitudinal ends of the conductor layer 692. The conductor layer 693 includes a first end 693*a* and a second end 693*b* located at both longitudinal ends of the conductor layer 693. Each of the first ends 691*a*, 692*a*, and 693*a* is located at a position closer to the first conductor part 80E of the shield conductor 80 than to the second conductor part 80F of the shield conductor 80 (upper position in FIG. 9C). Each of the second ends 691*b*, 692*b*, and 693*b* is located at a position closer to the second conductor part 80F of the shield conductor 80 than to the first conductor part 80E of the shield conductor 80 (lower position in FIG. 9C).

Two through holes 68T1*a* are connected to a portion near the first end 691*a* of the conductor layer 691. Two through holes 68T1*b* are connected to a portion near the second end 691*b* of the conductor layer 691. Two through holes 68T2*a* are connected to a portion near the first end 692*a* of the conductor layer 692. Two through holes 68T2*b* are connected to a portion near the second end 692*b* of the conductor layer 692. Two through holes 68T3*a* are connected to a portion near the first end 693*a* of the conductor layer 693. Two through holes 68T3*b* are connected to a portion near the second end 693*b* of the conductor layer 693.

Figure 10A:
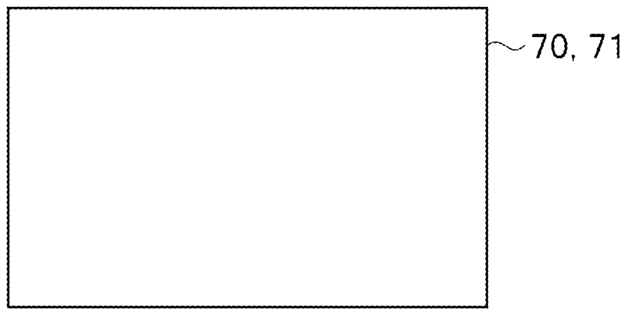
FIG. 10A is an explanatory diagram showing a patterned surface of each of twentieth and twenty-first dielectric layers of the stack of the multilayer electronic component according to the embodiment of the present invention.

FIG. 10A shows a patterned surface of each of the twentieth and twenty-first dielectric layers 70 and 71. Neither conductor layers nor through holes are formed on the patterned surface of each of the dielectric layers 70 and 71.

Figure 10B:
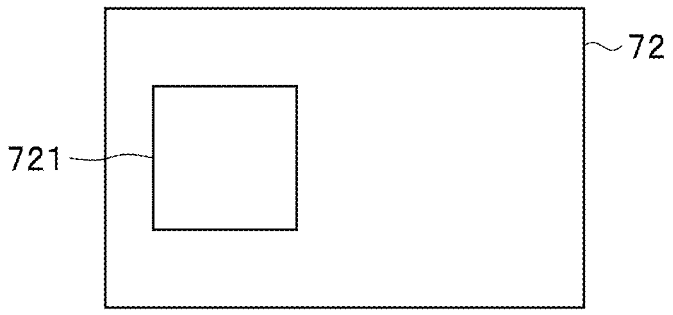
FIG. 10B is an explanatory diagram showing a patterned surface of a twenty-second dielectric layer of the stack of the multilayer electronic component according to the embodiment of the present invention.

FIG. 10B shows a patterned surface of the twenty-second dielectric layer 72. A mark 721 is formed on the patterned surface of the dielectric layer 72.

The stack 50 shown in FIGS. 2 and 3 is formed by stacking the first to twenty-second dielectric layers 51 to 72 such that the patterned surface of the first dielectric layer 51 serves as the first surface 50A of the stack 50 and the surface of the twenty-second dielectric layer 72 opposite to the patterned surface thereof serves as the second surface 50B of the stack 50.

Figure 11:
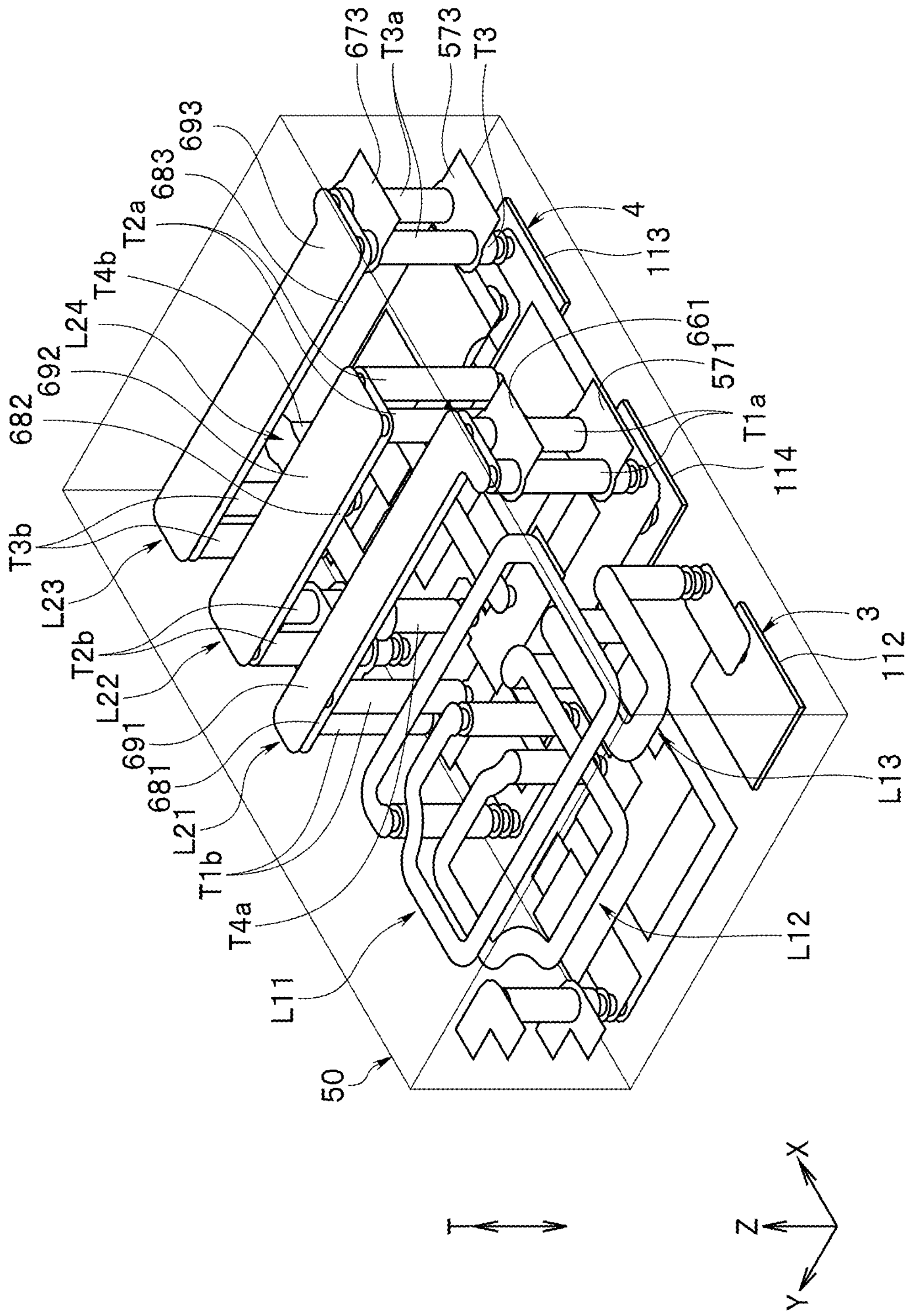
FIG. 11 is a perspective view showing an internal structure of the stack of the multilayer electronic component according to the embodiment of the present invention.

FIG. 11 shows an internal structure of the stack 50 formed by stacking the first to twenty-second dielectric layers 51 to 72. As shown in FIG. 11, in the internal structure of the stack 50, the plurality of conductor layers and the plurality of through holes shown in FIGS. 4A to 9C are stacked. Note that the mark 721 is omitted in FIG. 11.

Correspondence between the circuit components of the electronic component 1 shown in FIG. 1 and the internal components of the stack 50 shown in FIGS. 4A to 10B will be described below. First, the first filter 10 will be described.

The inductor L11 is constituted by the inductor conductor layer 651. The inductor L12 is constituted by the inductor conductor layer 621. The inductor L13 is constituted by the inductor conductor layer 622.

The capacitor C11 is constituted by the conductor layers 521 and 531, and the dielectric layer 52 interposed between these conductor layers. The capacitor C12 is constituted by the conductor layers 532 and 541, and the dielectric layer 53 interposed between these conductor layers. The capacitor C13 is constituted by the conductor layers 531 and 541, and the dielectric layer 53 interposed between these conductor layers.

Next, the components of the second filter 20 will be described. The first inductor L21 is constituted by the inductor conductor layers 681 and 691 and the through holes 53T1*a*, 54T1*a*, 54T1*b*, 55T1*a*, 55T1*b*, 56T1*a*, 56T1*b*, 57T1*a*, 57T1*b*, 58T1*a*, 58T1*b*, 60T1*a*, 60T1*b*, 61T1*a*, 61T1*b*, 62T1*a*, 62T1*b*, 63T1*a*, 63T1*b*, 64T1*a*, 64T1*b*, 65T1*a*, 65T1*b*, 66T1*a*, 66T1*b*, 67T1*a*, 67T1*b*, 68T1*a*, and 68T1*b*.

The second inductor L22 is constituted by the inductor conductor layers 682 and 692 and the through holes 53T2*b*, 54T2*a*, 54T2*b*, 55T2*a*, 55T2*b*, 56T2*a*, 56T2*b*, 57T2*a*, 57T2*b*, 58T2*a*, 58T2*b*, 60T2*a*, 60T2*b*, 61T2*a*, 61T2*b*, 62T2*a*, 62T2*b*, 63T2*a*, 63T2*b*, 64T2*a*, 64T2*b*, 65T2*a*, 65T2*b*, 66T2*a*, 66T2*b*, 67T2*a*, 67T2*b*, 68T2*a*, and 68T2*b*.

The third inductor L23 is constituted by the inductor conductor layers 683 and 693 and the through holes 53T3, 54T3, 54T3*b*, 55T3, 55T3*b*, 56T3, 56T3*b*, 57T3*a*, 57T3*b*, 58T3*a*, 58T3*b*, 60T3*a*, 60T3*b*, 61T3*a*, 61T3*b*, 62T3*a*, 62T3*b*, 63T3*a*, 63T3*b*, 64T3*a*, 64T3*b*, 65T3*a*, 65T3*b*, 66T3*a*, 66T3*b*, 67T3*a*, 67T3*b*, 68T3*a*, and 68T3*b*.

The fourth inductor L24 is constituted by the inductor conductor layer 641 and the through holes 55T4*a*, 55T4*b*, 56T4*a*, 56T4*b*, 57T4*a*, 57T4*b*, 58T4*a*, 58T4*b*, 60T4*a*, 60T4*b*, 61T4*a*, 61T4*b*, 62T4*a*, 62T4*b*, 63T4*a*, and 63T4*b*.

The capacitor C21 is constituted by the conductor layers 522 and 533, and the dielectric layer 52 interposed between these conductor layers. The capacitor C22 is constituted by the conductor layers 542 and 551, and the dielectric layer 54 interposed between these conductor layers. The capacitor C23 is constituted by the conductor layers 534 and 542, and the dielectric layer 53 interposed between these conductor layers. The capacitor C24 is constituted by the conductor layers 543 and 561, and the dielectric layers 54 and 55 each interposed between these conductor layers. The capacitor C25 is constituted by the conductor layers 534 and 543, and the dielectric layer 53 interposed between these conductor layers.

The capacitor C26 is constituted by the conductor layers 544 and 552, and the dielectric layer 54 interposed between these conductor layers. The capacitor C27 is constituted by the conductor layers 534 and 544, and the dielectric layer 53 interposed between these conductor layers. The capacitor C28 is constituted by the conductor layers 552 and 561, and the dielectric layer 55 interposed between these conductor layers.

Figure 12:
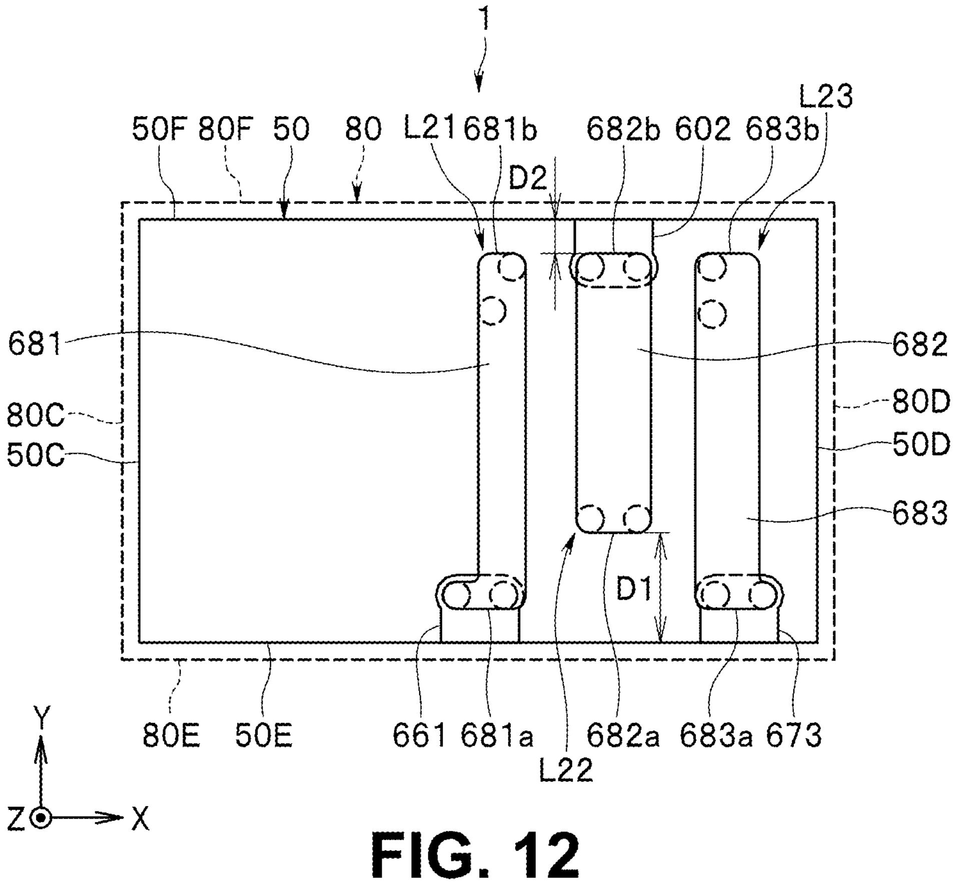
FIG. 12 is a plan view showing a part of the internal structure of the multilayer electronic component according to the embodiment of the present invention.

Next, structural features of the electronic component 1 according to the present embodiment will be described with reference to FIGS. 1 to 12. FIG. 12 is a plan view showing a part of an internal structure of the electronic component 1. Note that FIG. 12 shows an internal structure of the stack 50 in a view from the second surface 50B side of the stack 50. In FIG. 12, the conductor part 80B of the shield conductor 80 (see FIG. 2) is omitted.

First, features related to the first to third inductors L21, L22, and L23 of the second filter 20 will be described. The second inductor L22 is arranged between the first inductor L21 and the third inductor L23. The first to third inductors L21, L22, and L23 are arranged in this order, from the side surface 50C of the stack 50 towards the side surface 50D of the stack 50.

Any of the first to third inductors L21, L22, and L23 is an inductor wound around an axis extending in a direction orthogonal to the stacking direction T. Here, a columnar structure including a plurality of through holes connected in series is referred to as a columnar conductor. The columnar conductor extends in the direction parallel to the stacking direction T. Each of the first to third inductors L21, L22, and L23 includes at least one conductor layer and a plurality of columnar conductors.

Each of the first to third inductors L21, L22, and L23 is also a winding having a rectangular shape or substantially rectangular shape. For the winding having the rectangular shape or substantially rectangular shape, when the winding is considered to be a rectangle, the number of times of winding may be ¼ times per side of the rectangle. In the present embodiment, the number of times of winding for each of the first to third inductors L21, L22, and L23 is ¾ times.

The first inductor L21 includes the conductor layer 681, two columnar conductors T1a each connected to a portion near the first end 681a of the conductor layer 681, and two columnar conductors T1b each connected to a portion near the second end 681b of the conductor layer 681. The conductor layer 681 extends along a plane crossing the stacking direction T, that is, the patterned surface of the dielectric layer 68. The two columnar conductors T1a are formed by connecting the through holes 53T1a, 54T1a, 55T1a, 56T1a, 57T1a, 58T1a, 60T1a, 61T1a, 62T1a, 63T1a, 64T1a, 65T1a, 66T1a, and 67T1a in series to each other. The two columnar conductors T1b are formed by connecting the through holes 54T1b, 55T1b, 56T1b, 57T1b, 58T1b, 60T1b, 61T1b, 62T1b, 63T1b, 64T1b, 65T1b, 66T1b, and 67T1b in series to each other.

The first inductor L21 is wound around a first axis orthogonal to the stacking direction T such that a first opening surrounded by the conductor layer 681, the two columnar conductors T1a, and the two columnar conductors T1b is formed. The first axis may extend in a direction parallel to the X direction.

The first inductor L21 further includes the conductor layer 691 and the through holes 68T1a and 68T1b electrically connecting the conductor layer 681 and the conductor layer 691. Note that, in FIG. 12, the conductor layer 691 and the through holes 68T1a and 68T1b of the first inductor L21 are omitted.

The second inductor L22 includes the conductor layer 682, two columnar conductors T2a each connected to a portion near the first end 682a of the conductor layer 682, and two columnar conductors T2b each connected to a portion near the second end 682b of the conductor layer 682. The conductor layer 682 extends along a plane crossing the stacking direction T, that is, the patterned surface of the dielectric layer 68. The two columnar conductors T2a are formed by connecting the through holes 54T2a, 55T2a, 56T2a, 57T2a, 58T2a, 60T2a, 61T2a, 62T2a, 63T2a, 64T2a, 65T2a, 66T2a, and 67T2a in series to each other. The two columnar conductors T2b are formed by connecting the through holes 53T2b, 54T2b, 55T2b, 56T2b, 57T2b, 58T2b, 60T2b, 61T2b, 62T2b, 63T2b, 64T2b, 65T2b, 66T2b, and 67T2b in series to each other.

The second inductor L22 is wound around a second axis orthogonal to the stacking direction T such that a second opening surrounded by the conductor layer 682, the two columnar conductors T2a, and the two columnar conductors T2b is formed. The second axis may extend in a direction parallel to the X direction.

The second inductor L22 further includes the conductor layer 692 and the through holes 68T2a and 68T2b electrically connecting the conductor layer 682 and the conductor layer 692. Note that, in FIG. 12, the conductor layer 692 and the through holes 68T2a and 68T2b of the second inductor L22 are omitted.

The third inductor L23 includes the conductor layer 683, two columnar conductors T3a each connected to a portion near the first end 683a of the conductor layer 683, and two columnar conductors T3b each connected to a portion near the second end 683b of the conductor layer 683. The conductor layer 683 extends along a plane crossing the stacking direction T, that is, the patterned surface of the dielectric layer 68. The two columnar conductors T3a are formed by connecting the through holes 57T3a, 58T3a, 60T3a, 61T3a, 62T3a, 63T3a, 64T3a, 65T3a, 66T3a, and 67T3a in series to each other. The two columnar conductors T3b are formed by connecting the through holes 54T3b, 55T3b, 56T3b, 57T3b, 58T3b, 60T3b, 61T3b, 62T3b, 63T3b, 64T3b, 65T3b, 66T3b, and 67T3b in series to each other. The third inductor L23 is wound around a third axis orthogonal to the stacking direction T such that a third opening surrounded by the conductor layer 683, the two columnar conductors T3a, and the two columnar conductors T3b is formed. The third axis may extend in a direction parallel to the X direction.

The third inductor L23 further includes the conductor layer 693, the through holes 68T3a and 68T3b electrically connecting the conductor layer 683 and the conductor layer 693, and a columnar conductor T3 connected in series to one of the two columnar conductors T3a. Note that, in FIG. 12, the conductor layer 693, the through holes 68T3a and 68T3b, and the columnar conductor T3 of the third inductor L23 are omitted. The columnar conductor T3 is formed by connecting the through holes 53T3, 54T3, 55T3, and 56T3 in series to each other.

As mentioned above, the other end of each of the first to third inductors L21, L22, and L23 is connected to the ground, in a circuit configuration. The two through holes 53T1a in the first inductor L21, the two through holes 53T2b in the second inductor L22, and the through hole 53T3 in the third inductor L23 are connected to the conductor layer 534. The conductor layer 534 is connected to the electrodes 114, 115, and 116 connected to the ground, via the conductor layers 521 and 524 and the through holes 51T5, 51T6, 51T7, 52T5, 52T6, and 52T7. In the present embodiment, an interface between the conductor layer 534 and the two through holes 53T1a corresponds to the other end of the first inductor L21. An interface between the conductor layer 534 and the two through holes 53T2b corresponds to the other end of the second inductor L22. An interface between the conductor layer 534 and the through hole 53T3 corresponds to the other end of the third inductor L23.

Here, a winding direction of an inductor is defined as a direction from one end of the inductor towards the other end of the inductor. The one end of the inductor is an end further from the ground in a circuit configuration, and the other end of the inductor is an end closer to the ground in a circuit configuration. A winding direction of the first inductor L21 is a direction heading from the two through holes 54T1b towards the two through holes 53T1a via the two columnar conductors T1b, the conductor layer 681, and the two columnar conductors T1a in order. A winding direction of the second inductor L22 is a direction heading from the two through holes 54T2*a* towards the two through holes 53T2*b* via the two columnar conductors T2*a*, the conductor layer 682, and the two columnar conductors T2*b* in order. A winding direction of the third inductor L23 is a direction heading from the two through holes 54T3*b* towards the through hole 53T3 via the two columnar conductors T3*b*, the conductor layer 683, the two columnar conductors T3*a*, and the columnar conductor T3 in order.

The first to third inductors L21, L22, and L23 are arranged such that the first opening of the first inductor L21, the second opening of the second inductor L22, and the third opening of the third inductor L23 overlap each other when viewed in a direction parallel to the X direction. The winding direction of the third inductor L23 is the same direction as the winding direction of the first inductor L21, in a view from the X direction. The winding direction of the second inductor L22 is a direction opposite to the winding direction of each of the first and third inductors L21 and L23, in a view from the X direction.

Next, features related to the first to third inductors L21, L22, and L23 and the shield conductor 80 will be described. As mentioned above, the first end 682*a* of the conductor layer 682 of the second inductor L22 is located at a position closer to the first conductor part 80E of the shield conductor 80 than to the second conductor part 80F of the shield conductor 80, and the second end 682*b* of the conductor layer 682 of the second inductor L22 is located at a position closer to the second conductor part 80F of the shield conductor 80 than to the first conductor part 80E of the shield conductor 80. In FIG. 12, an arrow denoted by a reference numeral D1 indicates spacing between the first end 682*a* of the conductor layer 682 and the first conductor part 80E. An arrow denoted by a reference numeral D2 indicates spacing between the second end 682*b* of the conductor layer 682 and the second conductor part 80F. The spacing D1 is greater than the spacing D2.

As shown in FIG. 12, the spacing D1 is greater than each of spacing between the first end 681*a* of the conductor layer 681 of the first inductor L21 and the first conductor part 80E and spacing between the first end 683*a* of the conductor layer 683 of the third inductor L23 and the first conductor part 80E. The spacing D2 is the same or substantially the same as each of spacing between the second end 681*b* of the conductor layer 681 of the first inductor L21 and the second conductor part 80F and spacing between the second end 683*b* of the conductor layer 683 of the third inductor L23 and the second conductor part 80F. Accordingly, the conductor layer 682 is shorter than each of the conductor layers 681 and 683.

Note that the shape and arrangement of the conductor layers 691 to 693 are the same or substantially the same as the shape and arrangement of the conductor layers 681 to 683, except the position in the stacking direction T. The above description of the spacings D1 and D2 also applies to the conductor layers 691 to 693. The above description of the spacings D1 and D2 serves as description of spacings D1 and D2 related to the conductor layers 691 to 693 when the conductor layers 681 to 683 are respectively replaced with the conductor layers 691 to 693 in the above description of the spacings D1 and D2.

The two columnar conductors T1*a* of the first inductor L21, the two columnar conductors T2*a* of the second inductor L22, and the two columnar conductors T3*a* of the third inductor L23 are located at a position closer to the first conductor part 80E than to the second conductor part 80F. The two columnar conductors T1*b* of the first inductor L21, the two columnar conductors T2*b* of the second inductor L22, and the two columnar conductors T3*b* of the third inductor L23 are located at a position closer to the second conductor part 80F than to the first conductor part 80E.

Next, features related to the shield conductor 80 and the ground will be described. The shield conductor 80 is connected to the electrodes 114, 115, and 116 connected to the ground, via a plurality of conductors provided in the stack 50. In other words, as mentioned above, the conductor layers 574 and 654 are connected to the second conductor part 80F and the conductor part 80C of the shield conductor 80. The conductor layer 654 is connected to the conductor layer 574 via a plurality of through holes. The conductor layer 574 is connected to the conductor layer 532 via a plurality of through holes. The conductor layer 532 is connected to the conductor layer 521 via a plurality of through holes. The conductor layers 521 is connected to the electrode 116 via the two through holes 51T7. The conductor layer 521 is connected to the conductor layer 534 via the two through holes 52T7. The conductor layer 534 is connected to the electrode 114 via the two through holes 52T5 and the two through holes 51T5, and is connected to the electrode 115 via the two through holes 52T6, the conductor layer 524, and the two through holes 51T6.

The conductor layers 571, 573, 661, and 673 are directly connected to the first conductor part 80E of the shield conductor 80. The conductor layers 572 and 602 are directly connected to the second conductor part 80F of the shield conductor 80. The conductor layers 571, 572, 573, 602, 661, and 673 are connected to the electrodes 114, 115, and 116 connected to the ground, via the shield conductor 80 and the above plurality of conductors.

The two columnar conductors T1*a* of the first inductor L21 are electrically connected to the conductor layers 571 and 661. The two columnar conductors T1*a* are electrically connected to the first conductor part 80E without via the conductor layer 681 of the first inductor L21 and the two columnar conductors T1*b*. The conductor layers 571 and 661 correspond to a "first connecting conductor" in the present invention. In other words, the conductor layers 571 and 661 connect the two columnar conductors T1*a* and the first conductor part 80E.

The two columnar conductors T2*b* of the second inductor L22 are electrically connected to the conductor layers 572 and 602. The two columnar conductors T2*b* are electrically connected to the second conductor part 80F without via the conductor layer 682 of the second inductor L22 and the two columnar conductors T2*a*. The conductor layers 572 and 602 correspond to a "second connecting conductor" in the present invention. In other words, the conductor layers 572 and 602 connect the two columnar conductors T2*b* and the second conductor part 80F.

The two columnar conductors T3*a* of the third inductor L23 are electrically connected to the conductor layers 573 and 673. The two columnar conductors T3*a* are electrically connected to the first conductor part 80E without via the conductor layer 683 of the third inductor L23 and the two columnar conductors T3*b*. The conductor layers 573 and 673 correspond to a "third connecting conductor" in the present invention. In other words, the conductor layers 573 and 673 connect the two columnar conductors T3*a* and the first conductor part 80E.

Next, features related to the first signal terminal 3, the first and second inductors L21 and L22, and the shield conductor 80 will be described. The first signal terminal 3, that is, the electrode 112, is arranged at a position closer to the first conductor part 80E of the shield conductor 80 than to the second conductor part 80F of the shield conductor 80. The electrode 112 is arranged at a position closer to the conductor part 80C of the shield conductor 80 than to the conductor part 80D of the shield conductor 80.

The first and second inductors L21 and L22 are arranged between the electrode 112 and the side surface 50D. The first inductor L21 is arranged between the electrode 112 and the second inductor L22 in a direction parallel to the X direction. The conductor layers 571 and 661 being the first connecting conductor are also arranged between the electrode 112 and the second inductor L22 in a direction parallel to the X direction.

Next, features related to the fourth inductor L24 of the second filter 20 will be described. The fourth inductor L24 includes the conductor layer 641, a columnar conductor T4*a* connected to a portion near the first end of the conductor layer 641, and a columnar conductor T4*b* connected to a portion near the second end of the conductor layer 641. The columnar conductor T4*a* is formed by connecting the through holes 55T4*a*, 56T4*a*, 57T4*a*, 58T4*a*, 60T4*a*, 61T4*a*, 62T4*a*, and 63T4*a* in series to each other. The columnar conductor T4*b* is formed by connecting the through holes 55T4*b*, 56T4*b*, 57T4*b*, 58T4*b*, 60T4*b*, 61T4*b*, 62T4*b*, and 63T4*b* in series to each other. The fourth inductor L24 is wound around a fourth axis orthogonal to the stacking direction T such that a fourth opening surrounded by the conductor layer 641, the columnar conductor T4*a*, and the columnar conductor T4*b* is formed. The fourth axis may extend in a direction parallel to the Y direction.

At least part of the fourth inductor L24 is present over a first space surrounded by the conductor layer 681 of the first inductor L21, the two columnar conductors T1*a*, and the two columnar conductors T1*b*, a second space surrounded by the conductor layer 682 of the second inductor L22, the two columnar conductors T2*a*, and the two columnar conductors T2*b*, and a third space surrounded by the conductor layer 683 of the third inductor L23, the two columnar conductors T3*a*, and the two columnar conductors T3*b*.

Now, the operation and effects of the electronic component 1 according to the present embodiment will be described. In the present embodiment, the two columnar conductors T1*a* of the first inductor L21, the two columnar conductors T2*a* of the second inductor L22, and the two columnar conductors T3*a* of the third inductor L23 are arranged near the first conductor part 80E of the shield conductor 80. The two columnar conductors T1*b* of the first inductor L21, the two columnar conductors T2*b* of the second inductor L22, and the two columnar conductors T3*b* of the third inductor L23 are arranged near the second conductor part 80F of the shield conductor 80. Thus, in the present embodiment, the first to third inductors L21, L22, and L23 may be coupled to each other via the first and second conductor parts 80E and 80F. As a result, desired characteristics may not be achieved.

In contrast, in the present embodiment, the two columnar conductors T1*a* of the first inductor L21 are connected to the first conductor part 80E by the conductor layers 571 and 661, and the two columnar conductors T3*a* of the third inductor L23 are connected to the first conductor part 80E by the conductor layers 573 and 673. On the other hand, the two columnar conductors T2*b* of the second inductor L22 are not directly connected to the first conductor part 80E, and are connected to the second conductor part 80F by the conductor layers 572 and 602. Accordingly, in the present embodiment, a direction of a current flowing through the second inductor L22 is a direction opposite to a direction of a current flowing through each of the first and third inductors L21 and L23, when viewed in the X direction or the −X direction. The second inductor L22 is arranged between the first inductor L21 and the third inductor L23. With this, the present embodiment can suppress coupling between the first inductor L21 and the second inductor L22 and coupling between the second inductor L22 and the third inductor L23. Therefore, the present embodiment can achieve desired characteristics while suppressing occurrence of an issue caused by the shield conductor 80.

In the present embodiment, the winding direction of the second inductor L22 is a direction opposite to the winding direction of each of the first and third inductors L21 and L23. Also with this, the present embodiment can suppress coupling between the first to third inductors L21, L22, and L23.

In the present embodiment, the spacing D1 between the first end 682*a* of the conductor layer 682 of the second inductor L22 and the first conductor part 80E is greater than the spacing D2 between the second end 682*b* of the conductor layer 682 and the second conductor part 80F. With this, the present embodiment can keep the two columnar conductors T2*a* of the second inductor L22 away from the first conductor part 80E, and can weaken coupling between the two columnar conductors T2*a* and the first conductor part 80E.

In the present embodiment, the second inductor L22 is connected to the ground. Particularly in the present embodiment, the two columnar conductors T2*b* of the second inductor L22 are connected to the second conductor part 80F by the conductor layers 572 and 602. The two columnar conductors T2*b* are electrically connected to the second conductor part 80F without via the conductor layer 682 of the second inductor L22 and the two columnar conductors T2*a*. The present embodiment can weaken coupling between the second inductor L22 and the shield conductor 80 more effectively than that of a case where the two columnar conductors T2*b* are kept away from the second conductor part 80F.

In the present embodiment, the electronic component 1 includes the first filter 10 and the second filter 20. The second filter 20 includes the second inductor L22. The present embodiment can weaken coupling between the second inductor L22 and the shield conductor 80, and thus can suppress coupling between the first filter 10 and the second filter 20 via the second inductor L22 and the shield conductor 80, thereby allowing deterioration of isolation characteristics between the first filter 10 and the second filter 20 to be suppressed.

In the present embodiment, the first filter 10 is provided between the common terminal 2 and the first signal terminal 3 in a circuit configuration, and the second filter 20 is provided between the common terminal 2 and the second signal terminal 4 in a circuit configuration. The first signal terminal 3, that is, the electrode 112, is arranged at a position closer to the first conductor part 80E than to the second conductor part 80F. The present embodiment can suppress coupling between the second inductor L22 and the electrode 112 via the first conductor part 80E by keeping the two columnar conductors T2*a* away from the first conductor part 80E, thereby allowing deterioration of isolation characteristics between the first signal terminal 3 and the second signal terminal 4 to be suppressed.

In the present embodiment, the conductor layers 571 and 661 being the first connecting conductor are arranged between the electrode 112 and the second inductor L22 when viewed in the stacking direction T. Also with this, the present embodiment can suppress coupling between the second inductor L22 and the electrode 112 via the first conductor part 80E.

Next, effects of the present embodiment will be described with reference to a result of a simulation. The simulation used a model of the example, a model of a first comparative example, a model of a second comparative example, and a model of a third comparative example. The model of the example is a model of the electronic component 1 according to the present embodiment.

The model of the first comparative example is a model of an electronic component of the first comparative example. In the electronic component of the first comparative example, a position of the second inductor L22 is reversed relative to that of the present embodiment. In other words, in the first comparative example, each of the first end 682*a* of the conductor layer 682 and the first end 692*a* of the conductor layer 692 is located at a position closer to the second conductor part 80F of the shield conductor 80 than to the first conductor part 80E of the shield conductor 80. Each of the second end 682*b* of the conductor layer 682 and the second end 692*b* of the conductor layer 692 is located at a position closer to the first conductor part 80E of the shield conductor 80 than to the second conductor part 80F of the shield conductor 80. The conductor layers 572 and 602 which are the second connecting conductor and to which the two columnar conductors T2*b* of the second inductor L22 are connected are directly connected to the first conductor part 80E of the shield conductor 80.

In the first comparative example, spacing between the first end 682*a* of the conductor layer 682 and the second conductor part 80F is greater than spacing between the second end 682*b* of the conductor layer 682 and the first conductor part 80E. A winding direction of the second inductor L22 is the same direction as a winding direction of each of the first and third inductors L21 and L23, in a view from the X direction.

Other configurations of the electronic component of the first comparative example are the same as the configurations of the electronic component 1 according to the present embodiment.

The model of the second comparative example is a model of an electronic component of the second comparative example. In the electronic component of the second comparative example, the spacing D1 between the first end 682*a* of the conductor layer 682 and the first conductor part 80E is smaller than that of the present embodiment. In the second comparative example, the spacing D1 is the same as each of spacing between the first end 681*a* of the conductor layer 681 of the first inductor L21 and the first conductor part 80E and spacing between the first end 683*a* of the conductor layer 683 of the third inductor L23 and the first conductor part 80E. Other configurations of the electronic component of the second comparative example are the same as the configurations of the electronic component 1 according to the present embodiment.

The model of the third comparative example is a model of an electronic component of the third comparative example. In the electronic component of the third comparative example, the conductor layers 571 and 661 which are the first connecting conductor and to which the two columnar conductors T1*a* of the first inductor L21 are connected are not provided. Accordingly, the first connecting conductor is absent between the electrode 112 and the second inductor L22. Other configurations of the electronic component of the third comparative example are the same as the configurations of the electronic component 1 according to the present embodiment.

In the simulation, the model of the example was designed such that a passband of the first filter 10, that is, the first passband, corresponds to 3.3 to 5.0 GHz, a passband of the second filter 20, that is, the second passband, corresponds to 7.7 to 8.2 GHz, and the second inductor L22 forms, in pass attenuation characteristics of the second filter 20, an attenuation pole formed in a passband lower than the second passband, the attenuation pole being closest to the second passband. In the model of the example, the spacing D1 between the first end 682*a* of the conductor layer 682 of the second inductor L22 and the first conductor part 80E of the shield conductor 80 is 325 μm.

The models of the first to third comparative examples were created by changing the configuration of the model of the example. Particularly, in the model of the second comparative example, the spacing D1 is 100 μm.

In the simulation, for each of the model of the example and the models of the first to third comparative examples, pass attenuation characteristics between the common terminal 2 and the first signal terminal 3, pass attenuation characteristics between the common terminal 2 and the second signal terminal 4, and frequency characteristics of isolation between the first signal terminal 3 and the second signal terminal 4 were computed. Note that the pass attenuation characteristics between the common terminal 2 and the first signal terminal 3 substantially indicates pass attenuation characteristics of the first filter 10, and the pass attenuation characteristics between the common terminal 2 and the second signal terminal 4 substantially indicates pass attenuation characteristics of the second filter 20.

The definition of the isolation between the first signal terminal 3 and the second signal terminal 4 is as follows. When a high-frequency signal having power P1 is input to the first signal terminal 3, power of a signal output from the second signal terminal 4 is assumed to be P2. The isolation I is defined by Equation (1) below.

$$I = 10\log(P2/P1) \tag{1}$$

Figure 13:
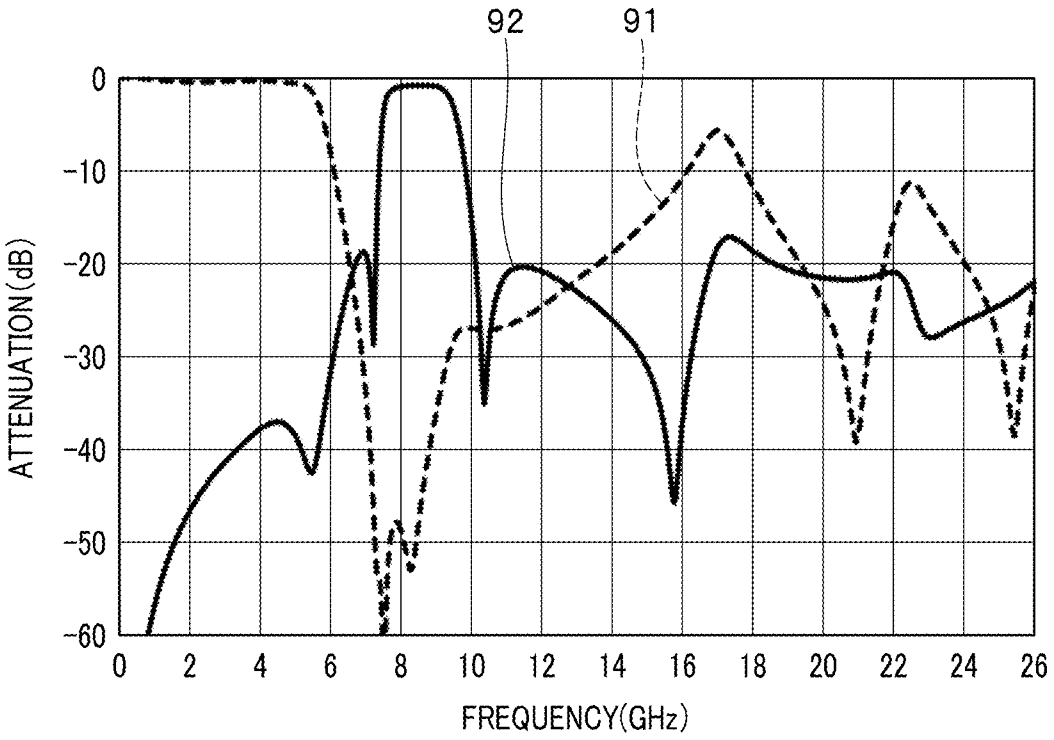
FIG. 13 is a characteristic diagram showing pass attenuation characteristics of a model of an example.
Figure 14:
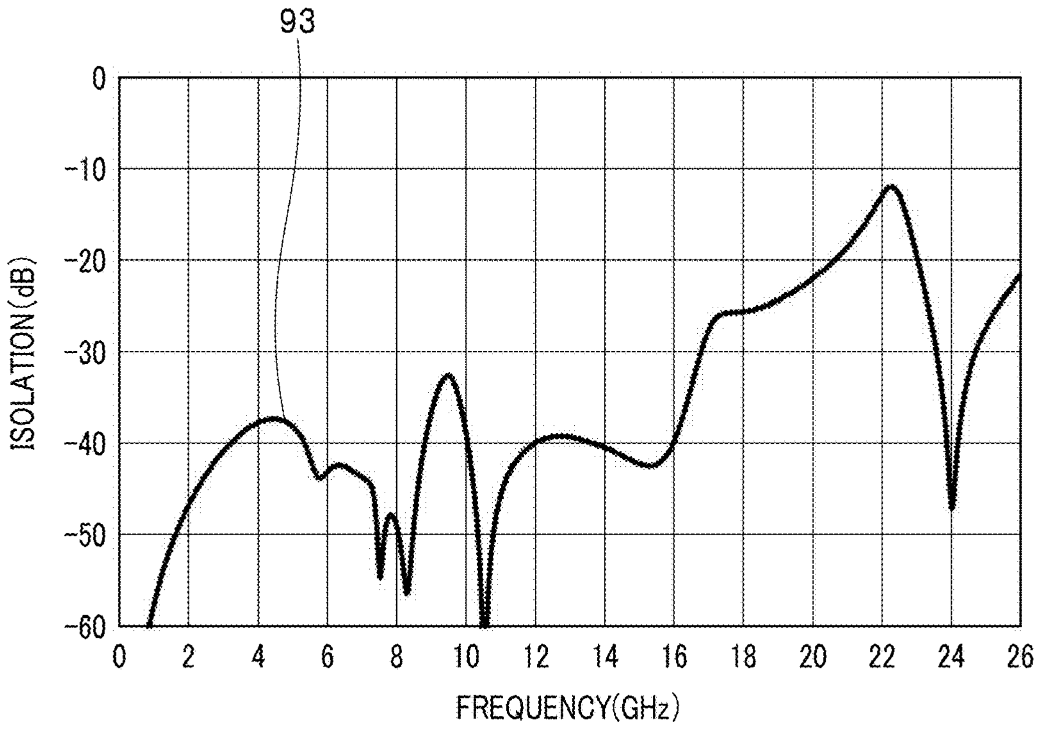
FIG. 14 is a characteristic diagram showing frequency characteristics of isolation of the model of the example.

FIG. 13 is a characteristic diagram showing the pass attenuation characteristics of the model of the example. FIG. 14 is a characteristic diagram showing the frequency characteristics of the isolation of the model of the example. In each of FIGS. 13 and 14, the horizontal axis indicates frequency. In FIG. 13, the vertical axis indicates attenuation. In FIG. 14, the vertical axis indicates isolation. In FIG. 13, a curve denoted by a reference numeral 91 indicates pass attenuation characteristics between the common terminal 2 and the first signal terminal 3 in the model of the example, in other words, pass attenuation characteristics of the first filter 10. A curve denoted by a reference numeral 92 indicates pass attenuation characteristics between the common terminal 2 and the second signal terminal 4 in the model of the example, in other words, pass attenuation characteristics of the second filter 20. In FIG. 14, a curve denoted by a reference numeral 93 indicates the frequency characteristics of the isolation in the model of the example.

As shown in FIG. 13, in the pass attenuation characteristics of the second filter 20 (reference numeral 92), an attenuation pole formed in a passband lower than the second passband and closest to the second passband is formed by the second inductor L22. As can be seen from FIGS. 13 and 14, an absolute value of isolation in the first passband and an absolute value of isolation in the second passband are sufficiently high.

Figure 15:
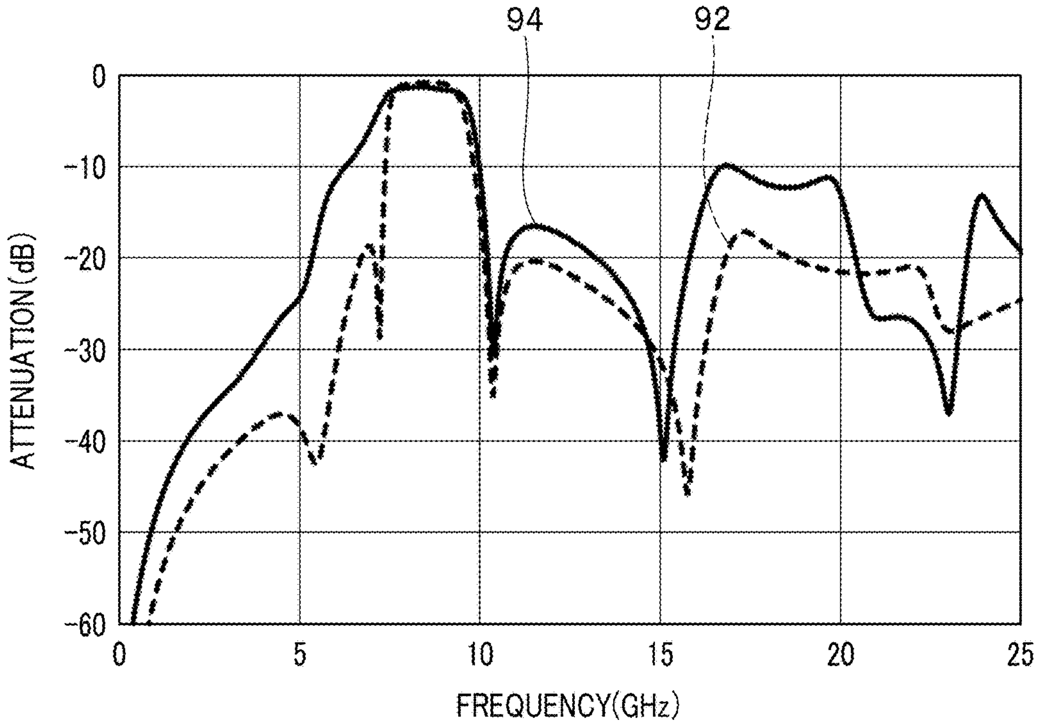
FIG. 15 RELATED ART
FIG. 15 is a characteristic diagram showing pass attenuation characteristics of a model of a first comparative example.

FIG. 15 is a characteristic diagram showing pass attenuation characteristics of the model of the first comparative example. In FIG. 15, the horizontal axis indicates frequency and the vertical axis indicates attenuation. In FIG. 15, a curve denoted by a reference numeral 94 indicates pass attenuation characteristics between the common terminal 2 and the second signal terminal 4 in the model of the first comparative example, in other words, pass attenuation characteristics of the second filter 20. FIG. 15 also shows the pass attenuation characteristics of the second filter 20 in the model of the example (reference numeral 92).

As shown in FIG. 15, in the model of the first comparative example, an absolute value of the attenuation is not sufficiently large in a passband lower than the second passband. In the model of the first comparative example, the respective winding directions of the first to third inductors L21, L22, and L23 are the same direction when viewed in the X direction, thereby coupling the first inductor L21 and the second inductor L22 to each other and coupling the second inductor L22 and the third inductor L23 to each other. The first to third inductors L21, L22, and L23 are further coupled to each other via the shield conductor 80. Thus, in the model of the first comparative example, forming of an attenuation pole in the passband lower than the second passband fails, thereby preventing the absolute value of the attenuation from being sufficiently large in the passband lower than the second passband.

As can be seen from the result shown in FIG. 15, the present embodiment can suppress coupling between the first to third inductors L21, L22, and L23 by connecting the first and third inductors L21 and L23 to the first conductor part 80E, connecting the second inductor L22 to the second conductor part 80F, and causing the winding direction of the second inductor L22 to be a direction opposite to the respective winding directions of the first and third inductors L21 and L23, as mentioned above, thereby achieving desired characteristics.

Figure 16:
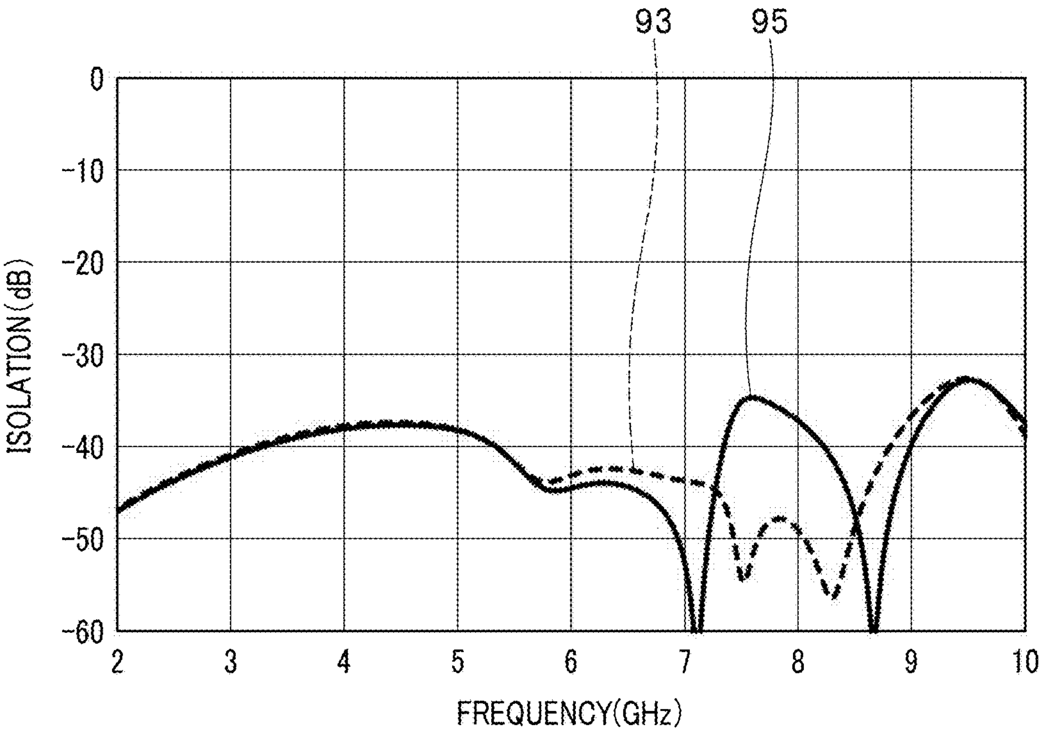
FIG. 16 RELATED ART
FIG. 16 is a characteristic diagram showing frequency characteristics of isolation of a model of a second comparative example.

FIG. 16 is a characteristic diagram showing frequency characteristics of isolation of the model of the second comparative example. In FIG. 16, the horizontal axis indicates frequency and the vertical axis indicates isolation. In FIG. 16, a curve denoted by a reference numeral 95 indicates the frequency characteristics of the isolation in the model of the second comparative example. FIG. 16 also shows the frequency characteristics of the isolation in the model of the example (reference numeral 93).

As shown in FIG. 16, in the model of the second comparative example, an absolute value of the isolation in the second passband is lower than that of the model of the example. In the model of the second comparative example, the small spacing D1 generates strong coupling between the two columnar conductors T2*a* of the second inductor L22 and the first conductor part 80E of the shield conductor 80, thereby coupling the second inductor L22 and the first signal terminal 3, that is, the electrode 112, via the first conductor part 80E.

As can be seen from the result shown in FIG. 16, the present embodiment can suppress deterioration of isolation characteristics between the first signal terminal 3 and the second signal terminal 4. In other words, the present embodiment can weaken coupling between the two columnar conductors T2*a* and the first conductor part 80E by keeping the two columnar conductors T2*a* away from the first conductor part 80E, thereby allowing coupling between the second inductor L22 and the shield conductor 80 to be weakened.

Figure 17:
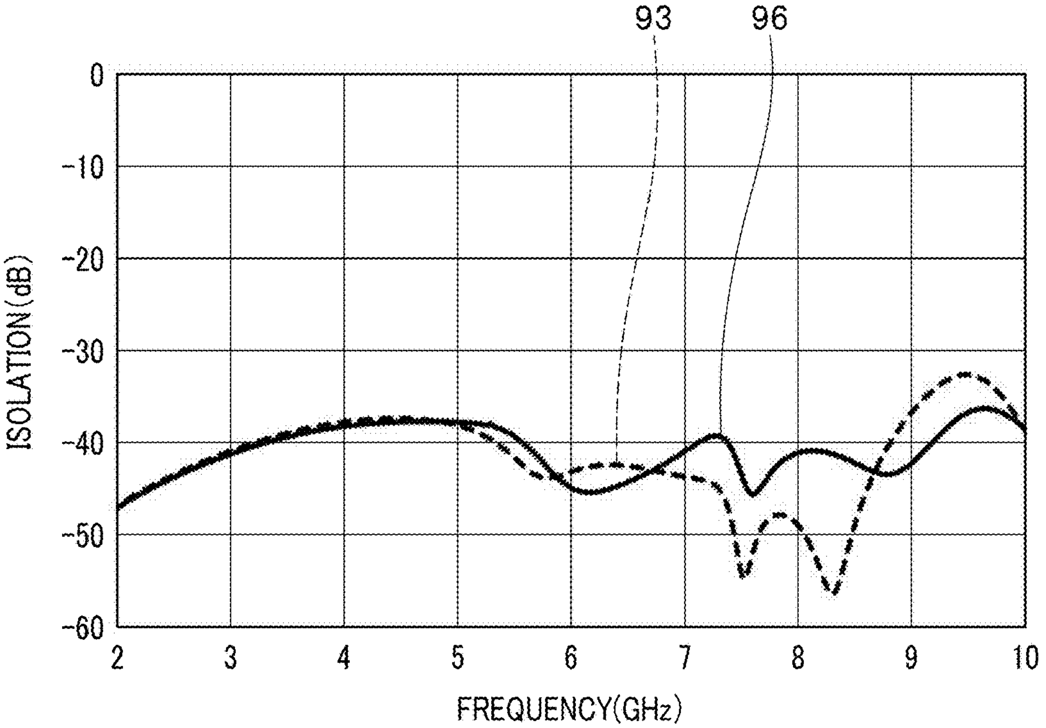
FIG. 17 RELATED ART
FIG. 17 is a characteristic diagram showing frequency characteristics of isolation of a model of a third comparative example.

FIG. 17 is a characteristic diagram showing frequency characteristics of isolation of the model of the third comparative example. In FIG. 17, the horizontal axis indicates frequency and the vertical axis indicates isolation. In FIG. 17, a curve denoted by a reference numeral 96 indicates the isolation in the model of the third comparative example. FIG. 17 also shows the isolation in the model of the example (reference numeral 93).

As shown in FIG. 17, in the model of the third comparative example, an absolute value of the isolation in the second passband is lower than that of the model of the example. As can be seen from the result shown in FIG. 17, the present embodiment can suppress coupling between the second inductor L22 and the first signal terminal 3, that is, the electrode 112, via the first conductor part 80E by providing the first connecting conductor (conductor layers 571 and 661) between the first signal terminal 3, that is, the electrode 112, and the second inductor L22.

The present invention is not limited to the foregoing embodiment, and various modifications may be made thereto. As far as the requirements of the appended claims are met, the present invention is applicable not only to electronic components having the circuit configuration shown in FIG. 1 but also to electronic components having any other various circuit configurations.

The number and positions of conductor layers included in each of the first to third connecting conductors are not limited to the example described in the embodiment, and are arbitrary. For example, each of the first to third connecting conductors may include a first conductor layer and a second conductor layer arranged at a position different from that of the first conductor layer in the stacking direction T. The first conductor layers of the first to third connecting conductors may be arranged at the same position or at different positions, in the stacking direction T. Likewise, the second conductor layers of the first to third connecting conductors may be arranged at the same position or at different positions, in the stacking direction T.

As described above, a multilayer electronic component of the present invention includes a stack including a plurality of dielectric layers stacked together, a first inductor, a second inductor, and a third inductor provided in the stack, and a shield conductor constituted by a conductor and integrated with the stack. The stack includes a first surface and a second surface located at both ends of the stack in a stacking direction of the plurality of dielectric layers, and a first side surface, a second side surface, a third side surface, and a fourth side surface connecting the first surface and the second surface. The first side surface and the second side surface face opposite directions. The third side surface and the fourth side surface face opposite directions. The shield conductor includes a first conductor part provided on the first side surface and a second conductor part provided on the second side surface.

The second inductor is arranged between the first inductor and the third inductor. Each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer. The first end of the conductor layer is located at a position closer to the first conductor part than to the second conductor part. The second end of the conductor layer is located at a position closer to the second conductor part than to the first conductor part.

The multilayer electronic component of the present invention further includes a first connecting conductor that connects the first columnar conductor of the first inductor and the first conductor part, a second connecting conductor that connects the second columnar conductor of the second inductor and the second conductor part, and a third connecting conductor that connects the first columnar conductor of the third inductor and the first conductor part.

The multilayer electronic component of the present invention may further include a first terminal and a second terminal provided on the first surface of the stack, and a first circuit provided between the first terminal and the second terminal in a circuit configuration. The first circuit may include the first inductor, the second inductor, and the third inductor. The multilayer electronic component of the present invention may further include a third terminal provided on the first surface of the stack, and a second circuit provided between the first terminal and the third terminal in a circuit configuration. The third terminal may be arranged at a position closer to the first conductor part than to the second conductor part. The second circuit may be configured to pass a signal of a frequency within a first passband. The first circuit may be configured to pass a signal of a frequency within a second passband higher than the first passband. The first circuit may be configured to pass a signal within a certain passband. In this case, the second inductor may form, in pass attenuation characteristics of the first circuit, an attenuation pole formed in a passband lower than the certain passband, the attenuation pole being closest to the certain passband.

In the multilayer electronic component of the present invention, spacing between the first end of the conductor layer of the second inductor and the first conductor part may be greater than spacing between the first end of the conductor layer of each of the first inductor and the third inductor and the first conductor part.

In the multilayer electronic component of the present invention, the conductor layer of the second inductor may be shorter than the conductor layer of each of the first inductor and the third inductor.

The multilayer electronic component of the present invention may further include a parallel resonance circuit including a fourth inductor and a capacitor provided in the stack, and provided on a path connecting a node present between one end of the first inductor and one end of the second inductor in a circuit configuration and one end of the third inductor. At least part of the fourth inductor may be present over a first opening surrounded by the conductor layer of the first inductor, the first columnar conductor, and the second columnar conductor, a second opening surrounded by the conductor layer of the second inductor, the first columnar conductor, and the second columnar conductor, and a third opening surrounded by the conductor layer of the third inductor, the first columnar conductor, and the second columnar conductor.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayer electronic component comprising:
- a stack including a plurality of dielectric layers stacked together;
- a first inductor, a second inductor, and a third inductor provided in the stack; and
- a shield conductor constituted by a conductor and integrated with the stack, wherein
- the stack includes a first surface and a second surface located at both ends of the stack in a stacking direction of the plurality of dielectric layers, and a first side surface, a second side surface, a third side surface, and a fourth side surface connecting the first surface and the second surface,
- the first side surface and the second side surface face opposite directions,
- the third side surface and the fourth side surface face opposite directions,
- the shield conductor includes a first conductor part provided on the first side surface and a second conductor part provided on the second side surface,
- the second inductor is arranged between the first inductor and the third inductor,
- each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer,
- the first end of the conductor layer is located at a position closer to the first conductor part than to the second conductor part, and
- the second end of the conductor layer is located at a position closer to the second conductor part than to the first conductor part,
- the multilayer electronic component further comprises:
- a first connecting conductor that connects the first columnar conductor of the first inductor and the first conductor part;
- a second connecting conductor that connects the second columnar conductor of the second inductor and the second conductor part; and
- a third connecting conductor that connects the first columnar conductor of the third inductor and the first conductor part,
- the first columnar conductor of the first inductor is electrically connected to the first conductor part by the first connecting conductor without via the conductor layer and the second columnar conductor of the first inductor,
- the second columnar conductor of the second inductor is electrically connected to the second conductor part by the second connecting conductor without via the conductor layer and the first columnar conductor of the second inductor, and
- the first columnar conductor of the third inductor is electrically connected to the first conductor part by the third connecting conductor without via the conductor layer and the second columnar conductor of the third inductor.

2. The multilayer electronic component according to claim 1, further comprising:
- a first terminal and a second terminal provided on the first surface of the stack; and
- a first circuit provided between the first terminal and the second terminal in a circuit configuration, wherein
- the first circuit includes the first inductor, the second inductor, and the third inductor.

3. The multilayer electronic component according to claim 2, further comprising:

a third terminal provided on the first surface of the stack; and a second circuit provided between the first terminal and the third terminal in a circuit configuration, wherein the third terminal is arranged at a position closer to the first conductor part than to the second conductor part.

4. The multilayer electronic component according to claim 3, wherein the second circuit is configured to pass a signal of a frequency within a first passband, and the first circuit is configured to pass a signal of a frequency within a second passband higher than the first passband.

5. The multilayer electronic component according to claim 3, wherein the first circuit is configured to pass a signal within a certain passband, and the second inductor forms, in pass attenuation characteristics of the first circuit, an attenuation pole formed in a passband lower than the certain passband, the attenuation pole being closest to the certain passband.

6. The multilayer electronic component according to claim 1, wherein spacing between the first end of the conductor layer of the second inductor and the first conductor part is greater than spacing between the first end of the conductor layer of each of the first inductor and the third inductor and the first conductor part.

7. The multilayer electronic component according to claim 1, wherein the conductor layer of the second inductor is shorter than the conductor layer of each of the first inductor and the third inductor.

8. The multilayer electronic component according to claim 1, further comprising:

a parallel resonance circuit including a fourth inductor and a capacitor provided in the stack, and provided on a path connecting a node present between one end of the first inductor and one end of the second inductor in a circuit configuration and one end of the third inductor.

9. The multilayer electronic component according to claim 8, wherein at least part of the fourth inductor is present over a first opening surrounded by the conductor layer of the first inductor, the first columnar conductor, and the second columnar conductor, a second opening surrounded by the conductor layer of the second inductor, the first columnar conductor, and the second columnar conductor, and a third opening surrounded by the conductor layer of the third inductor, the first columnar conductor, and the second columnar conductor.

10. A multilayer electronic component comprising:

a stack including a plurality of dielectric layers stacked together;

a first inductor, a second inductor, and a third inductor provided in the stack; and a shield conductor constituted by a conductor and integrated with the stack, wherein the stack includes a first surface and a second surface located at both ends of the stack in a stacking direction of the plurality of dielectric layers, and a first side surface, a second side surface, a third side surface, and a fourth side surface connecting the first surface and the second surface, the first side surface and the second side surface face opposite directions, the third side surface and the fourth side surface face opposite directions, the shield conductor includes a first conductor part provided on the first side surface and a second conductor part provided on the second side surface, the second inductor is arranged between the first inductor and the third inductor, each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer, the first end of the conductor layer is located at a position closer to the first conductor part than to the second conductor part, and the second end of the conductor layer is located at a position closer to the second conductor part than to the first conductor part, the multilayer electronic component further comprises:

a first connecting conductor that connects the first columnar conductor of the first inductor and the first conductor part;

a second connecting conductor that connects the second columnar conductor of the second inductor and the second conductor part;

a third connecting conductor that connects the first columnar conductor of the third inductor and the first conductor part;

a first terminal and a second terminal provided on the first surface of the stack;

a first circuit provided between the first terminal and the second terminal in a circuit configuration, wherein the first circuit includes the first inductor, the second inductor, and the third inductor;

a third terminal provided on the first surface of the stack; and a second circuit provided between the first terminal and the third terminal in a circuit configuration, wherein the third terminal is arranged at a position closer to the first conductor part than to the second conductor part.

11. A multilayer electronic component comprising:

a stack including a plurality of dielectric layers stacked together;

a first inductor, a second inductor, and a third inductor provided in the stack; and a shield conductor constituted by a conductor and integrated with the stack, wherein the stack includes a first surface and a second surface located at both ends of the stack in a stacking direction of the plurality of dielectric layers, and a first side surface, a second side surface, a third side surface, and a fourth side surface connecting the first surface and the second surface, the first side surface and the second side surface face opposite directions, the third side surface and the fourth side surface face opposite directions, the shield conductor includes a first conductor part provided on the first side surface and a second conductor part provided on the second side surface, the second inductor is arranged between the first inductor and the third inductor, each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer, the first end of the conductor layer is located at a position closer to the first conductor part than to the second conductor part, and the second end of the conductor layer is located at a position closer to the second conductor part than to the first conductor part, the multilayer electronic component further comprises:

a first connecting conductor that connects the first columnar conductor of the first inductor and the first conductor part;

a second connecting conductor that connects the second columnar conductor of the second inductor and the second conductor part; and a third connecting conductor that connects the first columnar conductor of the third inductor and the first conductor part, and spacing between the first end of the conductor layer of the second inductor and the first conductor part is greater than spacing between the first end of the conductor layer of each of the first inductor and the third inductor and the first conductor part.

12. A multilayer electronic component comprising:

a stack including a plurality of dielectric layers stacked together;

a first inductor, a second inductor, and a third inductor provided in the stack; and a shield conductor constituted by a conductor and integrated with the stack, wherein the stack includes a first surface and a second surface located at both ends of the stack in a stacking direction of the plurality of dielectric layers, and a first side surface, a second side surface, a third side surface, and a fourth side surface connecting the first surface and the second surface, the first side surface and the second side surface face opposite directions, the third side surface and the fourth side surface face opposite directions, the shield conductor includes a first conductor part provided on the first side surface and a second conductor part provided on the second side surface, the second inductor is arranged between the first inductor and the third inductor, each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer, the first end of the conductor layer is located at a position closer to the first conductor part than to the second conductor part, and the second end of the conductor layer is located at a position closer to the second conductor part than to the first conductor part, the multilayer electronic component further comprises:

a first connecting conductor that connects the first columnar conductor of the first inductor and the first conductor part;

a second connecting conductor that connects the second columnar conductor of the second inductor and the second conductor part; and a third connecting conductor that connects the first columnar conductor of the third inductor and the first conductor part, and the conductor layer of the second inductor is shorter than the conductor layer of each of the first inductor and the third inductor.

13. A multilayer electronic component comprising:

a stack including a plurality of dielectric layers stacked together;

a first inductor, a second inductor, and a third inductor provided in the stack; and a shield conductor constituted by a conductor and integrated with the stack, wherein the stack includes a first surface and a second surface located at both ends of the stack in a stacking direction of the plurality of dielectric layers, and a first side surface, a second side surface, a third side surface, and a fourth side surface connecting the first surface and the second surface, the first side surface and the second side surface face opposite directions, the third side surface and the fourth side surface face opposite directions, the shield conductor includes a first conductor part provided on the first side surface and a second conductor part provided on the second side surface, the second inductor is arranged between the first inductor and the third inductor, each of the first inductor, the second inductor, and the third inductor includes a conductor layer extending along a plane crossing the stacking direction and having a first end and a second end located at both longitudinal ends of the conductor layer, a first columnar conductor extending in a direction parallel to the stacking direction and connected to a portion near the first end of the conductor layer, and a second columnar conductor extending in a direction parallel to the stacking direction and connected to a portion near the second end of the conductor layer, the first end of the conductor layer is located at a position closer to the first conductor part than to the second conductor part, and the second end of the conductor layer is located at a position closer to the second conductor part than to the first conductor part, the multilayer electronic component further comprises:

a first connecting conductor that connects the first columnar conductor of the first inductor and the first conductor part;

a second connecting conductor that connects the second columnar conductor of the second inductor and the second conductor part;

a third connecting conductor that connects the first columnar conductor of the third inductor and the first conductor part; and a parallel resonance circuit including a fourth inductor and a capacitor provided in the stack, and provided on a path connecting a node present between one end of the first inductor and one end of the second inductor in a circuit configuration and one end of the third inductor, wherein at least part of the fourth inductor is present over a first opening surrounded by the conductor layer of the first inductor, the first columnar conductor, and the second columnar conductor, a second opening surrounded by the conductor layer of the second inductor, the first columnar conductor, and the second columnar conductor, and a third opening surrounded by the conductor layer of the third inductor, the first columnar conductor, and the second columnar conductor.

* * * * *